United States Patent [19]
Magri' et al.

[11] Patent Number: 6,054,737
[45] Date of Patent: *Apr. 25, 2000

[54] HIGH DENSITY MOS TECHNOLOGY POWER DEVICE

[75] Inventors: Angelo Magri', Belpasso; Ferruccio Frisina, Sant'Agata Li Battiati; Giuseppe Ferla, Catania, all of Italy

[73] Assignees: SGS-Thomson Microelectronics S.r.l., Agrate Brianza; Consorzio per la Ricerca sulla Microelettronica nel Mezzogiorno, Catania, both of Italy

[ * ] Notice: This patent is subject to a terminal disclaimer.

[21] Appl. No.: 08/738,584

[22] Filed: Oct. 29, 1996

[30] Foreign Application Priority Data

Oct. 30, 1995 [EP] European Pat. Off. .............. 95830453

[51] Int. Cl.⁷ .............................. H01L 29/76; H01L 29/74
[52] U.S. Cl. ......................... 257/341; 257/139; 257/342; 257/401
[58] Field of Search .................................. 257/139, 341, 257/342, 401

[56] References Cited

U.S. PATENT DOCUMENTS

| | | | |
|---|---|---|---|
| 4,015,278 | 3/1977 | Fukuta | 357/22 |
| 4,055,884 | 11/1977 | Jambotkar | 29/571 |
| 4,145,700 | 3/1979 | Jambotkar | 357/23 |
| 4,344,081 | 8/1982 | Pao et al. | 357/43 |

(List continued on next page.)

FOREIGN PATENT DOCUMENTS

| | | | |
|---|---|---|---|
| 1 123 119 | 5/1982 | Canada | H01L 29/04 |
| 1 136 291 | 11/1982 | Canada | H01L 29/94 |
| 0 252 236 | 1/1988 | European Pat. Off. | H01L 29/78 |
| 0252236 | 1/1988 | European Pat. Off. | |
| 0 405 138 | 1/1991 | European Pat. Off. | H01L 29/72 |
| 0405138 | 1/1991 | European Pat. Off. | |
| 0 543 313 | 5/1993 | European Pat. Off. | H01L 29/78 |
| 51-48981 | 4/1976 | Japan | H01L 29/78 |
| 51-85381 | 7/1976 | Japan | H01L 29/78 |
| 51-23088 | 9/1977 | Japan | H01L 29/78 |
| 52-65943 | 9/1977 | Japan | H01L 29/78 |
| 53-66181 | 6/1978 | Japan | H01L 29/78 |
| 53-74385 | 7/1978 | Japan | H01L 29/76 |
| 53-135284 | 11/1978 | Japan | H01L 29/78 |
| 2 087 648 | 5/1982 | United Kingdom | H01L 23/00 |
| WO94 11904 | 5/1994 | WIPO | H01L 29/78 |

OTHER PUBLICATIONS

European Search Report from European Patent Application No. 95830453.7, filed Oct. 30, 1995.

(List continued on next page.)

Primary Examiner—Steven H. Loke
Assistant Examiner—Ori Nadav
Attorney, Agent, or Firm—Wolf, Greenfield & Sacks, P.C.; James H. Morris; Theodore E. Galanthay

[57] ABSTRACT

A MOS technology power device comprises a semiconductor material layer of a first conductivity type, a plurality of elementary functional units, a first insulating material layer placed above the semiconductor material layer and a conductive material layer placed above the first insulating material layer. Each elementary functional unit includes an elongated body region of a second conductivity type formed in the semiconductor material layer. Each elementary functional unit further includes a first elongated window in the conductive material layer extending above the elongated body region. Each elongated body region includes a source region doped with dopants of the first conductivity type, intercalated with a portion of the elongated body region wherein no dopant of the first conductivity type are provided. The MOS technology power device further includes a second insulating material layer disposed above the conductive material layer and disposed along elongated edges of the first elongated window. The second insulating material layer includes a second elongated window extending above each elongated body region. The second insulating material layer seals the edges of the conductive material layer from a source metal layer disposed over the second insulating material layer. The source metal layer contacts each body region and each source region through each second elongated window along the length of the elongated body region.

27 Claims, 16 Drawing Sheets

U.S. PATENT DOCUMENTS

| | | | |
|---|---|---|---|
| 4,345,265 | 8/1982 | Blanchard | 257/341 |
| 4,399,449 | 8/1983 | Herman et al. | 357/53 |
| 4,412,242 | 10/1983 | Herman et al. | 357/52 |
| 4,414,560 | 11/1983 | Lidow | 357/39 |
| 4,642,666 | 2/1987 | Lidow et al. | 357/23.4 |
| 4,705,759 | 11/1987 | Lidow et al. | 437/29 |
| 4,716,126 | 12/1987 | Cogan | 437/24 |
| 4,798,810 | 1/1989 | Blanchard et al. | 437/29 |
| 4,816,882 | 3/1989 | Blanchard et al. | 357/23.4 |
| 4,931,408 | 6/1990 | Hshieh | 437/44 |
| 4,959,699 | 10/1993 | Lidow et al. | 257/328 |
| 4,974,059 | 11/1990 | Kinzer | 357/23.4 |
| 5,015,593 | 5/1991 | Yawata et al. | 437/25 |
| 5,031,009 | 7/1991 | Fujihira | 257/139 |
| 5,043,781 | 8/1991 | Nishiura et al. | 357/23.6 |
| 5,119,153 | 6/1992 | Korman et al. | 357/23.4 |
| 5,130,767 | 7/1992 | Lidow et al. | 357/23.4 |
| 5,191,396 | 3/1993 | Lidow et al. | 257/339 |
| 5,338,961 | 8/1994 | Lidow et al. | 257/342 |
| 5,397,728 | 3/1995 | Sasaki et al. | 437/44 |
| 5,418,179 | 5/1995 | Hotta | 257/371 |
| 5,426,320 | 6/1995 | Zambrano | 257/328 |
| 5,442,216 | 8/1995 | Gough | 257/355 |
| 5,508,217 | 4/1996 | Sawada | 437/40 |
| 5,563,436 | 10/1996 | Barret et al. | 257/328 |
| 5,621,234 | 4/1997 | Kato | 257/339 |
| 5,631,483 | 5/1997 | Ferla et al. | 257/341 |
| 5,670,392 | 9/1997 | Ferla et al. | 438/197 |
| 5,731,604 | 3/1998 | Kinzer | 257/153 |

OTHER PUBLICATIONS

Stanford Electronics Laboratories, Integrated Circuits Laboratory, Stanford University, Stanford, Ca, Technical Report No. 4956–1, Mar. 1976, Michael Donald Pocha, "High Voltage Double Diffused MOS Transistors for Integrated Circuits" pp. 229–240.

IEEE Journal of Solid–State Circuits, vol. SC–11, No. 4, Aug. 1976, Isao Yoshida, et al., "A High Power MOSFET With a Vertical Drain Electrode And A Meshed Gate Structure", pp. 472–477.

Siliconix Technical Proposal in response to N.A.F.I., Solicitation #N00163–77–R–1197, Aug. 31, 1977, Labor And Materials to Design, Develop and Fabricate a 500V/2A N–Channel Metal Oxide Semiconductor F.E.T.

IEEE Transactions On Electron Devices, vol. ED–27, No. 2, Feb. 1980, S.C. Sun et al., "Modeling Of The On–Resistance Of LDMOS, VDMOS, and VMOS Power Transistors", pp. 356–367.

International Electron Devices Meeting—Tech. Digest, Dec. 8–10, 1980, Washington, D.C., pp. 91–94, J. Mena, et al., "High Frequency Performances of VDMOS Power Transistors".

Solid State Electronics, vol. 27, No. 5, pp. 419–432, 1984, P. McGregor, et al, "Small–Signal High–Frequency Performance Of Power MOS Transistors".

IEEE Transactions on Electron Devices, vol. ED–31, No. 1 Jan. 1984, pp. 109–113, Jose G. Mena, et al., "Breakdown Voltage Design Considerations in VDMOS Structures".

Solid State Electronics, vol. 29, No. 6, pp. 647–656, 1986, Jose G. Mena, et al., "High–Voltage Multiple–Resistivity Drift–Region LDMOS".

Solid State Electronics, 1977, vol. 29, pp. 875–878, Surinder Krishna, "Second Breakdown in High Voltage MOS Transistors".

Electronic Design, For Engineers and Engineering Managers—Worldwide, pp. 8276–8282, "HEXFET, A New Power Technology Cuts On–Resistance, Boosts Ratings".

Laid Open Patent Specification No. 85073/80, Laid Open Date: Jun. 26, 1980, Patent No. 75/162,677, Kanushiki Kaisha Hitachi Seisakusho, "Methods For Manufacturing Insulated Gate Type Field Effect Transistors".

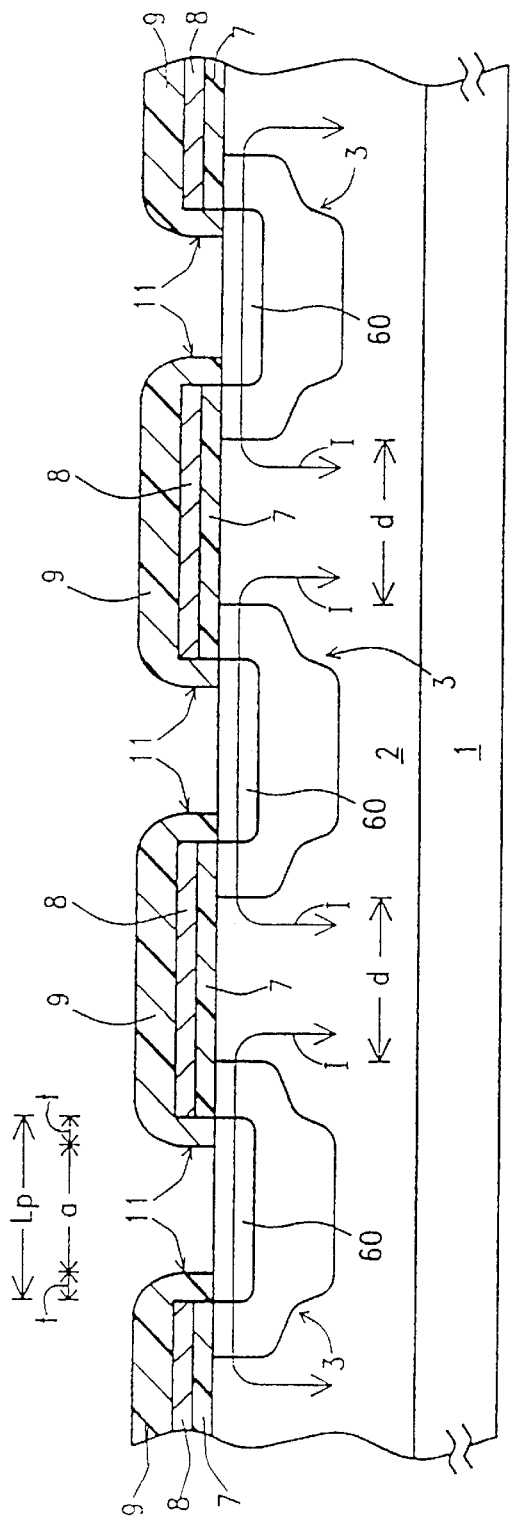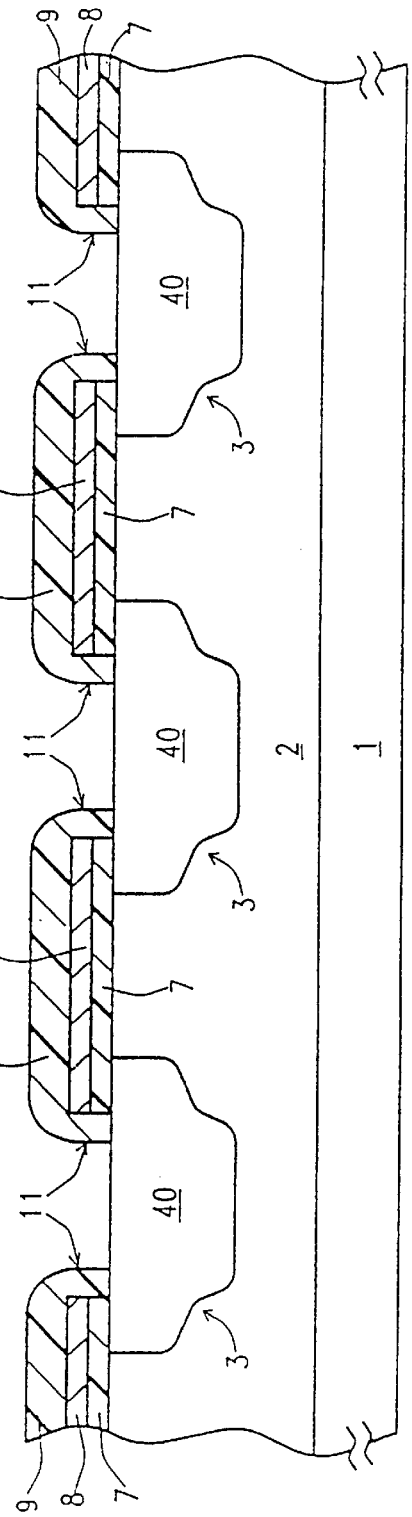

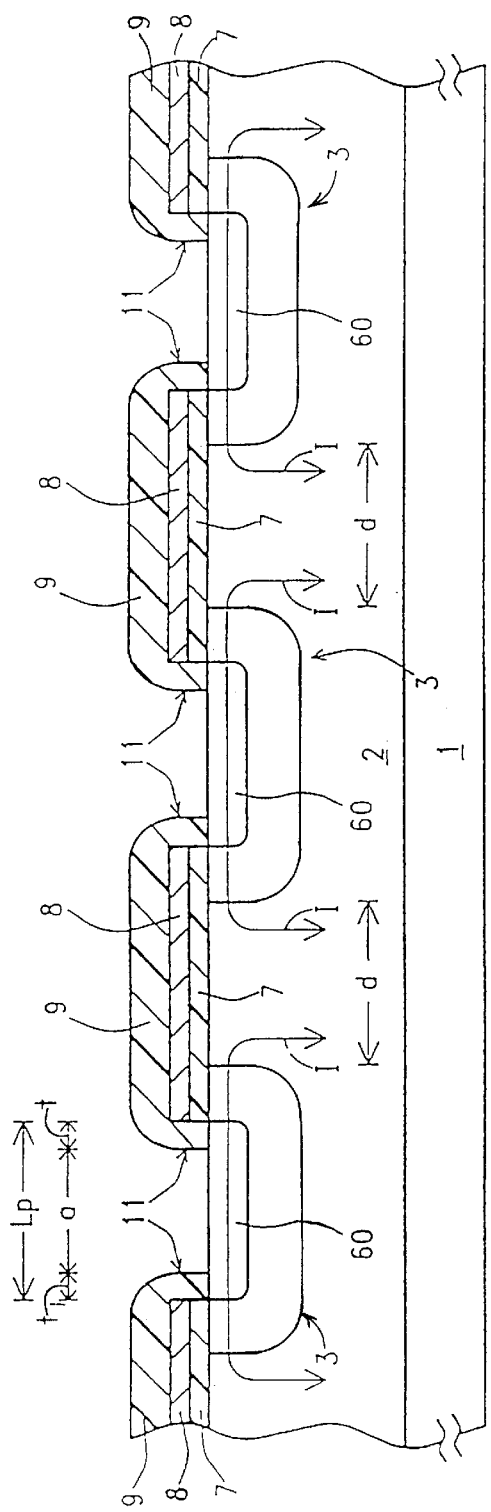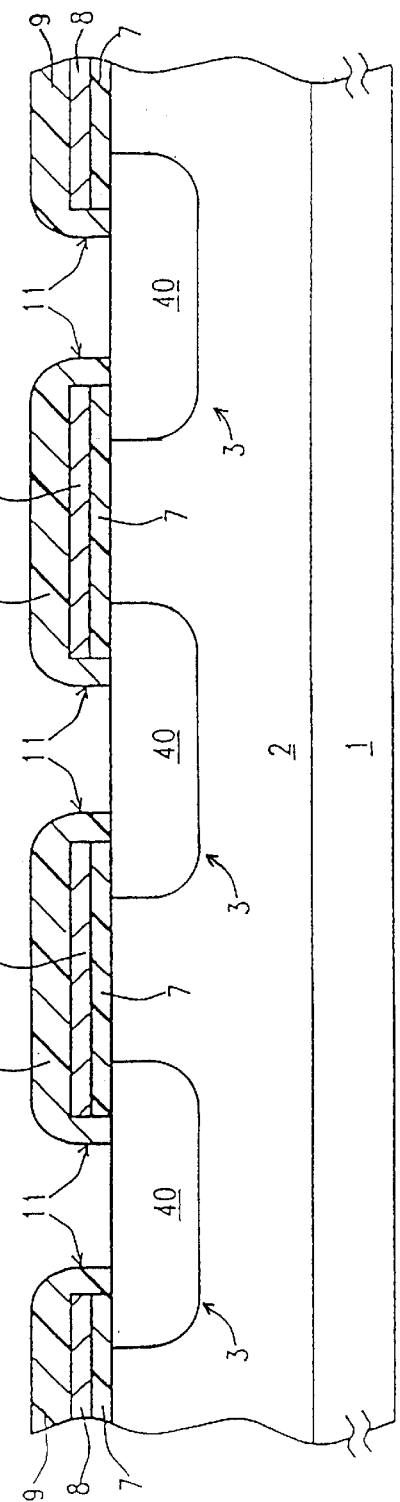

HIGH DENSITY MOS TECHNOLOGY POWER DEVICE

BACKGROUND OF THE INVENTION

1. Field of the Invention

The prevent nvention relates to either discrete devices or integrated power semiconductor devices including MOS-gated power devices such as, for example, power MOSFETS, IGBTs, MOS-gated thyristors or other MOS-gated power devices. In particular, the invention relates to a MOS-gated power device having a smaller minimum dimension Lp that yields an increased density of MOS-gated power devices per unit area.

2. Discussion of the Related Art

MOS technology power devices as known in the related art are composed of a plurality of elementary functional units integrated in a semiconductor chip. Each elementary functional unit is a vertical MOSFET, and all the elementary functional units are connected in parallel. With this arrangement, each elementary vertical MOSFET contributes a fraction of an overall current capacity of the power device.

A MOS technology power device chip typically includes a lightly doped semiconductor layer of a first conductivity type forming a common drain layer for all the elementary vertical MOSFETS. The lightly doped layer is superimposed over a heavily doped semiconductor substrate. Each elementary functional unit includes a body region of a second conductivity type formed in the common drain layer. U.S. Pat. No. 4,593,302 (Lidow et al.) discloses a so called "cellular" power device, wherein the body region of the elementary functional units has a polygonal layout, such as for example a square or hexagonal shape. For this reason, the elementary functional units are also called "elementary cells". In addition, MOS technology power devices are also known in the related art wherein the body region of each elementary functional units is an elongated stripe.

For any of the above power MOS devices, a typical vertical structure of the elementary functional units (i.e. a cross-section view) of the MOS technology power device is as shown in FIG. 1. In FIG. 1, the heavily doped semiconductor substrate is indicated by reference numeral 1 and the lightly doped semiconductor layer is indicated by reference numeral 2. The body region 3 of the elementary functional unit includes a central heavily doped portion 4, called a "deep body region", and a lateral lightly doped portion 5, having a lower dopant concentration than the heavily doped deep body region, which forms a channel region of the elementary vertical MOSFET. A doping level of the lateral portions 5 of the body region determines a threshold voltage of the power device. Inside the body region 3, a source region 6 of the same conductivity type as the common drain layer 2 is formed. A thin oxide layer 7 (a gate oxide layer) and a polysilicon layer 8 (a gate electrode of the power device) cover a surface of the semiconductor layer 2 between the body regions 3, and the layers also extend over the lightly doped lateral portion of the body regions. The polysilicon layer 8 is covered by a dielectric layer 9 in which contact windows 11 are opened over each body region to allow a superimposed metal layer 10 (a source electrode of the power device) to be deposited through the contact window and to contact the source regions 6 and the deep body region 4.

In the structure of FIG. 1, a short-circuit is defined between the source region and the deep body region to prevent a parasitic bipolar junction transistor having an emitter, a base and a collector respectively formed by the source region 6, the deep body region 4 and the heavily doped semiconductor substrate 1, from triggering on. The parasitic bipolar transistor will trigger "on" if the lateral current flow in the body below the source produces a voltage drop greater than approximately 0.7 V, forward biasing the emitter-to-base (EB) junction. The deep body region 4 increases the ruggedness of the power device because it reduces the base resistance of such a parasitic transistor.

The structure of FIG. 1 is manufactured by forming the common drain layer 2 over the heavily doped substrate 1, generally by means of an epitaxial growth. The thin oxide layer 7 is thermally grown over an active area of the common drain layer 2, wherein the elementary functional units of the MOS-gated power device will be formed, and the polysilicon layer 8 is deposited on the thin oxide layer. The deep body regions 4 are formed by selective introduction via a mask of a high dose of a dopant to form the central heavily doped deep body regions 4. Windows 12 are formed in the gate oxide layer and the polysilicon layer by a selective etching of the polysilicon and gate oxide layers via a second mask to open the windows 12 where the elementary functional units will be formed. The lateral lightly doped portions of the body regions are then formed by selective introduction of a low dose of dopants into the common drain layer through the windows to form the lightly doped portions of the body regions. Next, the source regions 6 are formed as will be described in more detail below, followed by deposition of the dielectric layer 9 and selective etching thereof to open the contact windows 11. The metal layer 10 is then deposited and patterned.

This process involves the use of a minimum of four photolithographic masks: a first mask is used for the formation of the deep body regions 4; a second mask is used to selectively etch the polysilicon 8 and gate oxide 7 layers; a third mask is used to form the source regions 6 and a fourth mask is used to open the contact windows 11 in the dielectric layer 9. The mask for the introduction of the dopants forming the source regions is provided partially by the polysilicon and oxide layers, and partially by photoresist isles over a middle portion of the deep body regions 4. The photoresist isles are formed by depositing a photoresist layer over the common drain layer, selectively exposing the photoresist layer to a light source, and selectively removing the photoresist layer to provide the photoresist isles.

Referring again to FIG. 1, a dimension Lp of each window 12 in the polysilicon 8 and gate oxide 7 layers is given by equation (1):

$$Lp = a + 2t \quad (1)$$

where "a" is the width of the contact window 11 in the dielectric layer 9 and "t" is the distance between an edge of the polysilicon 8 and gate oxide 7 layers and an edge of the window 11 in the dielectric layer 9. The dimension "a" of the contact window is given by equation (2):

$$a = c + 2b \quad (2)$$

where "b" is a distance between an edge of the contact window 11 and an inner edge of the source region 6, or in other words the length of the source region available to be contacted by the metal layer 10, and "c" is the dimension of a surface of the deep body region wherein the source regions are absent or in other words the distance between the inner edges of the source regions, corresponding to the length of the surface of the deep body region available to be contacted by the metal layer. The dimension Lp is therefore given by equation (3):

$$L_p = c + 2b + 2t \qquad (3)$$

Accordingly, the elementary functional units of the related art have the dimension Lp determined by "three feature sizes", in particular the dimension Lp depends on the parameters "c", "b" and "t".

In MOS technology power devices, the electrical parameters to be optimized are the output resistance in the "on" condition Ron, a gate-to-drain capacitance (feedback capacitance) and a gate-to-source capacitance (input capacitance) of the MOS technology power device for a specific die size and breakdown voltage. The output resistance Ron is the sum of several components, each of which is associated with a particular physical region of the device. More specifically, Ron is made up of the components as shown in equation (4):

$$Ron = Rc + Racc + Rjfet + Repi \qquad (4)$$

where Rc is a channel resistance associated with the channel region, Racc is an accumulation region resistance associated with a surface portion of the common drain layer between the body regions, Rjfet is a resistance associated with a portion of the common drain layer between depletion regions of the body regions 5, and Repi is a resistance associated with a portion of the drain layer beneath the body regions.

The channel resistance Rc depends on process parameters such as the dopant concentration of the channel region. In other words Rc is proportional to the threshold voltage of the MOS technology power device, and to the channel length. The accumulation region resistance Racc depends on the distance "d" between two adjacent body regions, and decreases as such distance decreases. The Rjfet resistance depends on a resistivity of the common drain layer and on the distance "d" between the body regions, and increases as such a distance decreases. The Repi resistance depends on the resistivity and a thickness of the common drain layer, two parameters which also determine a maximum voltage (Bvmax) that can be sustained by the MOS technology power device. Bvmax increases as the resistivity increases, as long as the epi layer is thick enough. The resistivity and the thickness are optimized for the lowest value of Repi. Further, the output resistance Ron is inversely proportional to an overall channel length of the MOS technology power device. In other words Ron is inversely proportional to a sum of the channel of the individual elementary functional units that make up the MOS technology power device. The longer the channel length per unit area of the MOS technology power device, the lower the output resistant Ron per unit area.

Thus, in order to reduce the Ron it is desirable to scale down the dimensions of the elementary functional units and in particular the distance "d" between the body regions as long as Rjfet is not significantly increased, or in other words to increase a density of elementary functional units per unit area. A reduction of the distance "d" between the body regions has a further advantage of lowering the input and feedback capacitances of the MOS technology power device, thus improving its dynamic performance. Also, in high-voltage MOS technology power devices, reducing the distance "d" between the body regions increases the device's ruggedness under switching conditions. A recent technological trend has therefore been toward increasing the density of elementary functional units per unit area, and MOS technology power devices with a density of up to six million elementary cells per square inch can be fabricated.

The structure of the related art however poses some limitations to the further reduction of the dimensions thereof. These limitations are essentially determined by a resolution and alignment characteristics of the photolithographic apparatus used in the process to manufacture the MOS technology power device. Referring again to FIG. 1, it is known that the dimension "c" must be sufficiently large enough to guarantee that the metal layer 10 contacts the body region, and can only be scaled down to the resolution limit of the photolithographic apparatus used to provide the region "c". In addition, the dimension "b" must be sufficiently large enough to guarantee that the metal layer contacts the source region 6, and must also allow for any alignment errors between the mask defining the contact window 11 in the dielectric layer 9 and the mask for the formation of the source regions. Further, the dimension "t" must be sufficiently large enough to guarantee that the polysilicon layer 8 is electrically insulated from the metal layer and must also take into account any alignment errors between the masks for the definition of the windows 12 in the polysilicon layer and the mask for forming the contact windows in the dielectric layer.

In addition, the structure of the elementary functional units according to the related art does not allow reduction of the distance "d" between the elementary functional units below certain values that depend on a voltage rating of the MOS technology power device. For example, the distance "d" is approximately 5 µm for low-voltage devices and in a range from 10 µm to 30 µm for medium- to high-voltage devices. A reduction of the distance "d" below the specified values would in fact cause a rapid increase in the Rjfet component of the Ron of the MOS technology power device, thereby increasing the value of Ron.

In view of the state of the art described, it is an object of the present invention to provide a new MOS technology power device structure which provides an improvement to the MOS technology power devices of the related art.

SUMMARY OF THE INVENTION

It is an object of the present invention o provide a power device having a higher scale of integration than the MOS technology power devices of the related art. In addition, it is an object of the present invention to provide a power device and a method for manufacturing of the power device that is not limited by the processing and alignment tolerances of the MOS technology power device of the related art. In particular, it is an object to provide a power device having a dimension Lp that is a function of two features.

According to the present invention, such objects are attained by a MOS technology power device having a semiconductor material layer of a first conductivity type and a plurality of elementary functional units. A first insulating material layer is placed above the semiconductor material layer and a conductive material layer is placed above the first insulating material layer. Each elementary functional unit includes a body region of a second conductivity type formed in the semiconductor material layer, wherein the body region is an elongated body region. Each elementary functional unit further includes a first elongated window in the first insulating material layer and the conductive material layer, extending above the elongated body region. Each elongated body region includes a source region doped with dopants of the first conductivity type, and intercalated with a body portion of the body region wherein no dopant of the first conductivity type are provided. In addition, each elementary unit includes a second insulating material layer disposed above the conductive material layer and that insulate edges of the first elongated window in the conductive material layer and the first insulating material layer from a metal layer disposed above the second insulating material layer. The second insulating material layer having a second elongated window above the elongated body region The metal layer contacts each body region and source region through the second elongated window of each elementary functional unit.

In one embodiment of the MOS-technology power device, the source region includes a plurality of source portions of the first conductivity type that extend in a longitudinal direction of the elongated body region and that are intercalated in the longitudinal direction with body portions of the elongated body region. In an alternative of this embodiment, a length of the source portions is greater than a length of the body portions, and the source portions and the body portions of the elongated body region are substantially aligned in a direction transverse to the longitudinal direction respectively with the source portions and the body portions in body regions of adjacent elementary functional units. In another alternative of this embodiment, a length of the source portions is greater than a length of the body portions, and the source portions and the body portions of the body stripe are substantially shifted in the longitudinal direction with respect to the source portions and the body portions in the body regions of the adjacent elementary functional units.

In another embodiment of the MOS-technology power device, each source region includes a plurality of source portions extending in the longitudinal direction of the elongated body region and intercalated with the body portions of the body region. A length of the source portions is substantially equal to a length of the body portions, and the source portions and the body portions of the elongated body region are substantially aligned in the transverse direction respectively with the body portions and the source portions of the body regions of the adjacent elementary functional units.

In another embodiment of the MOS-technology power device, the elongated body region includes a first longitudinal half-stripe and a second longitudinal half-stripe that are merged together along a longitudinal edge. Each half-stripe includes a plurality of source portions intercalated in the longitudinal direction with body portions of the half-stripe. The source portions and the body portions of the first longitudinal half-stripe are aligned in the transverse direction, respectively, with the body portions and the source portions in the second longitudinal half-stripe.

In another embodiment of the MOS-technology power device, the elongated body region includes a first longitudinal half-stripe and a second longitudinal half-stripe merged together along a longitudinal edge. The first longitudinal half-stripe includes an elongated source portions extending for substantially an entire length of the first longitudinal half-stripe. The second longitudinal half-stripe includes no dopants of the first conductivity type so that the elongated source region is adjacent the body region for the entire length of the elongated body region.

For each of the embodiments of the present invention, the elongated body region of each elementary functional unit and the layout of the source region inside the elongated body region allow the source metal layer to contact the source region and the body region along the length of the elongated body regions, and result in a reduced dimension $L_p$ of the elongated opening in the first insulating material layer and the conductive material layer in the direction transverse to the length of the elongated body region. Thus each of the embodiments of the present invention have a reduced dimension $L_p$ of each elementary functional unit, and an increased density of elementary functional units per unit area.

Also according to the present invention, there is provided a process for manufacturing a MOS technology power device, including forming a first insulating material layer over a semiconductor material layer of a first conductivity type, forming a first conductive material layer over the first insulating material layer, and selectively removing the first conductive material layer to open at least one first elongated window therein. An elongated body region of a second conductivity type is then formed in the semiconductor material layer under the first elongated window, and a source region of the first conductivity type is formed in the elongated body region, in such a way as to be intercalated in the longitudinal dimension with a body portion of the elongated body region wherein no dopants of the first conductivity type are provided. A second insulating material layer is disposed above the first conductive material layer and along edges of the first elongated window, a second elongated window is formed in the second insulating material and a second conductive material layer is provided over the second insulating material layer, and contacts the source region and the elongated body region through the second elongated window.

Preferably, the step of forming the elongated body region includes selectively introducing a dopant of the second conductivity type into the semiconductor material layer using the first conductive material layer as a mask, without the need of a dedicated mask for the formation of a heavily doped deep body region at the center of the elongated body region of the elementary functional units. In addition, the step of forming the source region preferably involves deposition of photoresist layer over the surface of the chip, selective exposition of the photoresist layer to a light source through a photolithographic mask, and selective removal of the photoresist layer from the surface of the chip. The photoresist layer, and the first conductive material layer are used as an implantation mask for introducing dopants of the first conductivity type to form the source regions in the body region. The steps for forming the source region eliminate a need to provide a tolerance for any misalignment between the photolithographic mask used for etching the photoresist layer and a photolithographic mask used for defining the elongated window. With this method, the transverse dimension $L_p$ of the elongated opening in the first insulating material layer and the conductive material layer, is reduced.

According to the present invention, the objects of the present invention can also be achieved with a MOS-gated apparatus, such as for example a MOSFET, an IGBT, a MOS-gated thyristor (MCT) or other MOS-gated power devices. A MOS-gated power device includes a semiconductor material of a first conductivity type that has a plurality of body regions of a second conductivity type formed in a surface of the semiconductor material. A source region of the first conductivity type is formed in a surface of each of the body regions. A first insulating material layer is disposed above the surface of the semiconductor material layer and a conductive material layer is disposed above the first insulating material layer. The conductive material layer includes a plurality of first elongated windows that are disposed above each of the plurality of body regions. A second insulating layer is disposed above the conductive material layer. A second elongated window is opened in the second insulating layer above the plurality of body regions and seals edges of the conductive material layer in the plurality of first elongated windows from a metal layer disposed above the second insulating layer. The metal layer contacts each of the plurality of body regions and each of the plurality of source regions through the plurality of second elongated windows.

Further, according to the present invention a process for manufacturing the MOS-gated apparatus includes providing a semiconductor substrate including the semiconductor material layer of the first conductivity type disposed over a highly doped semiconductor material layer, forming a first insulating material layer above the surface of the semiconductor material layer, and forming a conductive material layer above the first insulating material layer. The conductive material layer is selectively removed to provide the plurality of first elongated windows in the conductive material layer that expose the surface of the semiconductor material layer beneath each of the plurality of first elongated windows. The plurality of body regions of the second conductivity type are formed in the surface of the semiconductor material layer through the plurality of first elongated windows in the conductive material layer. The source region of the first conductivity type is also formed in each body region through the plurality of first elongated windows. An insulating layer is disposed above the conductive material layer and along the edges of the first elongated window. A second elongated window is opened in the insulating layer and a metal layer is provided above the insulating layer so as to contact each body region and each source region through each second elongated window in the insulating layer.

Other objects and features of the present invention will become apparent from the following detailed description when taken in connection with the following drawings. It is to be understood that the drawings are for the purpose of illustration only and are not intended as a definition of the limits of the invention.

BRIEF DESCRIPTION OF THE DRAWINGS

The foregoing and other objects and advantages will be more fully appreciated from the following drawing in which:

FIG. 3a is a cross-sectional view along line III—III in FIG. 2 illustrating a first embodiment of a body region of the first embodiment of the present invention;

FIG. 3b is a cross-sectional view along line III—III in FIG. 2 illustrating a second embodiment of a body region of the first embodiment of the present invention;

FIG. 4a is a cross-sectional view along line IV—IV in FIG. 2 illustrating a first embodiment of a body region of the first embodiment of the present invention;

FIG. 4b is a cross-sectional view along line IV—IV in FIG. 2 illustrating a second embodiment of a body region of the first embodiment of the present invention;

DETAILED DESCRIPTION

Figure 1:
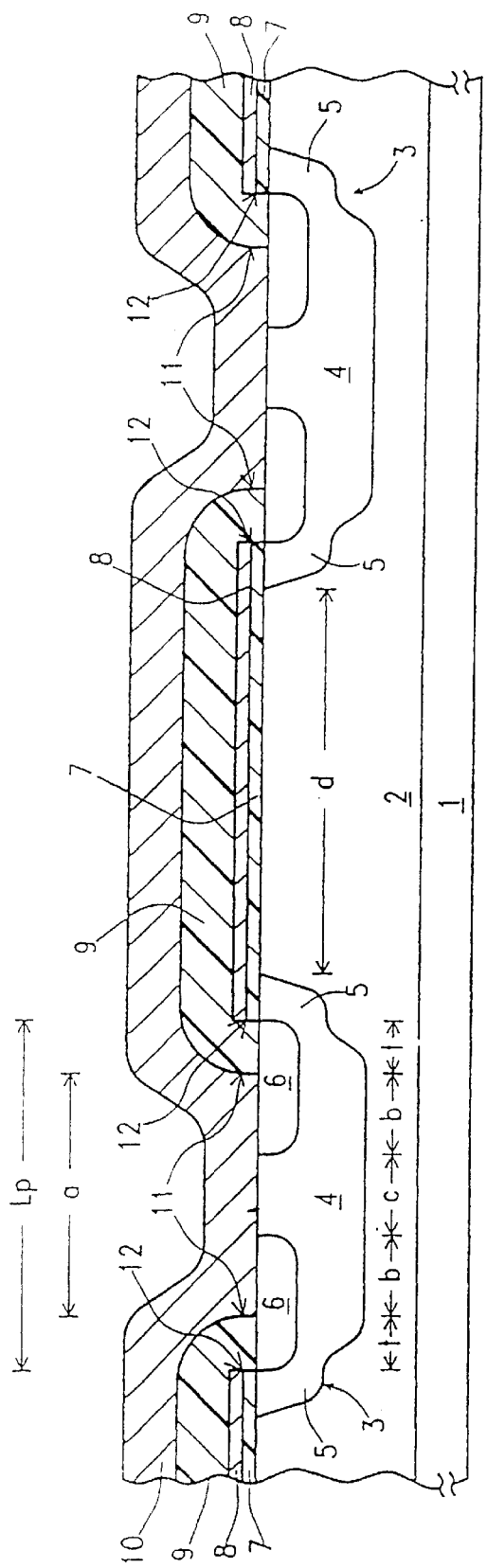
FIG. 1 is a cross-sectional view of a MOS technology power device according to the prior art.

As discussed above, FIG. 1 is a cross-sectional view of a MOS technology power device chip according to the related art. The power device chip includes a heavily doped semiconductor substrate 1, and a lightly doped epitaxial layer 2 of a first conductivity type formed over the semiconductor substrate. The MOS technology power device includes a plurality of elementary functional units formed in the epitaxial layer 2. Two of the elementary functional units are illustrated in FIG. 1.

Each elementary functional units includes a body region 3 of a second conductivity type formed in the epitaxial layer 2. Each body region 3 can have a polygonal layout, such as for example a square or a hexagonal shape, or can be formed as an elongated stripe that has a longitudinal direction in a direction into the Figure. In other words, FIG. 1 is a cross-sectional view in a direction transverse to a length of the elongated stripes. The body region includes a central heavily doped portion 4, called a "deep body region", and a lateral portion 5, having a lower dopant concentration, and which forms a channel region of the elementary functional unit. A doping level of the lateral portion 5 of the body region determines a threshold voltage of the power device.

The threshold voltage is the voltage at which the device begins to conduct. Inside each body region 3, is a source region 6 of the same conductivity type as the epitaxial layer 2. A thin oxide layer 7 (a gate oxide layer) and a polysilicon layer 8 cover a surface of portions of the epitaxial layer 2 between the body regions 3 of the two elementary functional units, and extend over the lateral portions 5 of the body regions 3 in each functional unit. A window 12 is provided in the polysilicon and gate oxide layers 8, 7 over the body region 3, and in particular over a surface of each source region and a surface of the deep body region. The polysilicon layer 8 is covered by a dielectric layer 9 in which a contact window 11 is opened over each body region 3, to expose a surface of an inner-portion of each of the source regions and a surface of the deep body region. A metal layer 10 making up the source electrode of the power device is placed over the dielectric layer and contacts the surface of the source regions 6 and the surface of the deep body region 4 through the contact window.

A size of each elementary functional unit of the MOS power device is a function of a dimension Lp of the window 12 in the polysilicon layer 8 and the gate oxide layer 7. As discussed above and illustrated in FIG. 1, the dimension Lp is a function of the features "a" and "t" as defined in equation (1):

$$Lp=a+2t \quad (1)$$

where "a" is the width of the contact window 11 in the dielectric layer 9 and "t" is the distance between an edge of each of the polysilicon layer 8 and gate oxide layer 7 and an edge of the dielectric layer 9. The width "a" of the contact window is defined in equation (2):

$$a=c+2b \quad (2)$$

where "b" is a distance between an edge of the contact window 11 in the dielectric layer 9 and an inner edge of the source region 6 or in other words the length of the surface of source region available to be contacted by the source metal layer 10, and "c" is the length of the surface of the deep body region wherein the source regions 6 are absent or in other words the distance between the inner edges of the source regions 6 corresponding to the length of the surface of the deep body region 3 available to be contacted by the source metal layer 10. The dimension Lp is therefore given by equation (3):

$$Lp=c+2b+2t. \quad (3)$$

The dimension Lp of each elementary functional unit of the related art is therefore determined by the three feature sizes "c", "b" and "t".

As discussed above, it is desirable to reduce the output resistance of the power device in the "on" condition by decreasing the size of each elementary functional unit of the MOS technology power device. In order to reduce the size of each elementary functionally unit, it is desirable to scale down the distance "d" between each of the elementary functionally units thereby resulting in an increase in the density of the elementary functional units per unit area of the MOS technology power device. In addition, as discussed above, the reduction in the distance "d" between the elementary functional units of the MOS technology power device has added advantages of lowering the gate-to-source capacitance (the input capacitance) and the gate-to-drain capacitance (the feedback capacitance) of the MOS technology power device, thereby resulting in an improvement in the dynamic performance of the MOS technology power device. Further, an added advantage of reducing the distance between the elementary functional units for a high-voltage MOS technology power device is that the high-voltage MOS technology power device is more rugged under switching conditions. The distance "d" cannot be reduced too much however, or Rjfet begins to increase. Therefore, it is an object of the power device of the present invention to increase the density of the elementary functional units per unit area.

A problem with the MOS technology power device of the related art illustrated in FIG. 1, is that each of the three features "c", "b", and "t" has a minimum possible size which is determined by a resolution limit and by alignment characteristics of a photolithographic apparatus used in the process of manufacturing the MOS technology power device. In particular, the distance "c" between the inner edges of the source regions must be large enough to provide sufficient area for the metal layer 10 to contact the surface of the deep body region 4. In addition, the distance "b" between the edge of the contact window 11 and the inner edge of each of the source regions 6 must also be large enough to provide an area sufficient for the metal layer 10 to contact the surface of each of the source regions 6, and must also be large enough to account for any alignment errors of the mask used to define the contact window 11 in the dielectric layer and the mask used to form the source regions 6 and the body region 3. Further, the distance "t" between the edges of the polysilicon layer 8 and the oxide layer 7 and the edge of the window 11 in the dielectric layer 9 should be large enough to insure that the polysilicon layer is electrically insulated from the metal layer, and also to take into account any or errors between the mask for defining the window 12 in the polysilicon and oxide layers and the mask for defining the contact window 11 in the dielectric layer. Still further, the distance "d" between each of the elementary finctional units is limited by a voltage rating desired for the MOS power device. For example, low-voltage power MOS devices typically have the distance "d" of approximately 5 $\mu$m while medium-voltage and high-voltage devices typically have the distance "d" in the range from 10 $\mu$m to 30 $\mu$m. As is known in the related art, reducing the distance "d" below these values results in an increase in the output resistance Ron of the MOS power device. Accordingly, the structure of the MOS power device of the related art has limits to which the size of each elementary functional unit can be decreased. The power device of the present invention improves upon the MOS power device of the related art with a structure that is reduced in size and provides an increased density per unit area.

In the following description, the reference numerals used in FIG. 1 will be used to indicate similar parts.

Figure 2:
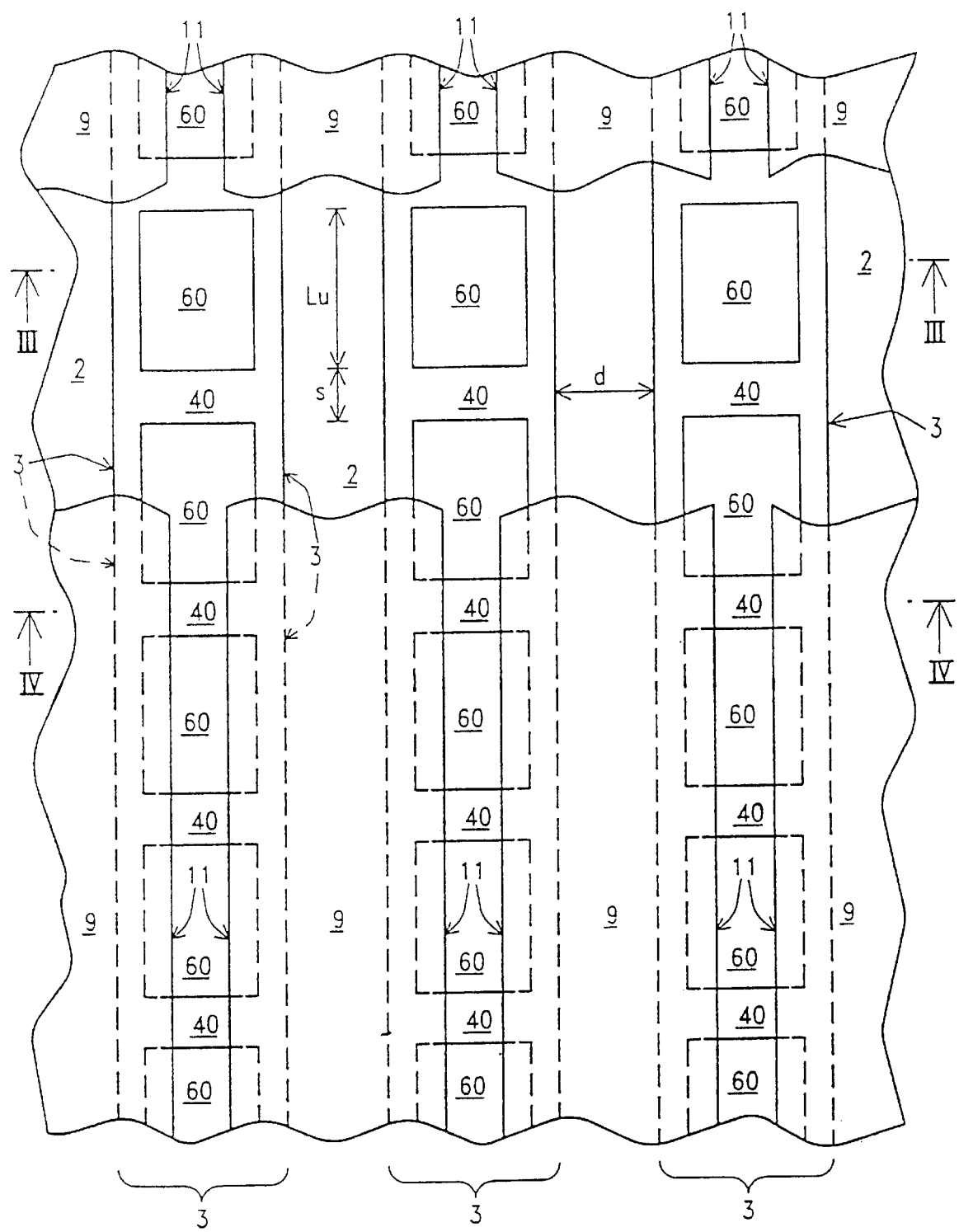
FIG. 2 is a top-plan view of a portion of MOS technology power device according to a first embodiment of the present invention.

FIG. 2 is a top-plan view of a portion of a MOS-gated power device according to a first embodiment of the present invention. It is to be appreciated that the term MOS-gated includes MOS power devices including MOSFETS, IGBTs, MOS-gated thyristors (MCT) and other MOS-gated power devices. As illustrated in FIG. 2 and in conjunction with cross-sectional views of FIGS. 3 and 4, the MOS-gated power device comprises a lightly doped semiconductor layer 2 of a first conductivity type, such as for example an epitaxial layer, superimposed over a heavily doped semiconductor substrate 1. FIGS. 3 and 4 are a cross-sectional view taken along lines III—III and IV—IV respectively of FIG. 2. In particular, FIGS. 3a and 4a illustrate a first embodiment of the body region of the first embodiment of the MOS-gated power device of the present invention and FIGS. 3b, 4b illustrate a second embodiment of the body region. The epitaxial layer 2 forms a common drain layer of the MOS-gated power device, and can be either of the N conductivity type for an N-channel device, or of the P conductivity type for a P-channel device. For a power MOSFET the substrate 1 is of the same conductivity type as the epitaxial layer 2, whereas for an Insulated Gate Bipolar Transistor (IGBT) the substrate 1 and the epitaxial layer 2 are of opposite conductivity types. The MOS-gated power device includes a plurality of elementary functional units formed in the epitaxial layer 2. Each elementary functional unit includes a body region 3 of the opposite conductivity type of the epitaxial layer 2. As illustrated in FIG. 2, the body regions 3 can be substantially parallel elongated stripes spaced apart by the distance "d" from each other. However, it is to be appreciated that the body regions can be any elongated shape such as for example, an elongated polygon. Inside each body stripe 3, a plurality of heavily doped regions 60 of the opposite conductivity type from the body stripe 3 are provided. The heavily doped regions 60 extend in the longitudinal direction of the body stripe 3, and are intercalated with body portions 40 of the body stripe 3. The heavily doped regions 60 form source regions of the MOS-gated power device.

The surface of the drain layer 2 is covered by a gate oxide layer 7, such as for example silicon dioxide, and a conductive layer 8, such as for example polysilicon, that forms the gate electrode of the MOS-gated power device. The gate oxide layer 7 and the polysilicon layer 8 cover the surface of the epitaxial layer between the body stripes 3 and extend over the stripes 3 to the edges of the regions 60. A dielectric layer 9 covers the polysilicon layer 8. Elongated openings 11 (contact windows) are provided in the dielectric layer 9 over the central portion of the stripes 3 to allow a metal layer (not shown) forming the source electrode of the MOS-gated power device to contact both the source regions 60 and the body portions 40 of the body stripes 3 through the elongated openings.

As illustrated in FIG. 3, the transverse dimension Lp of the window in the polysilicon and gate oxide layers 8 and 7 is given by:

Lp=a+2t where a is the transverse dimension of the contact window 11 and t is the distance between the edge of the polysilicon layer and the edge of the dielectric layer 9. However, the structure of the present invention, is different from the related art structure because the source regions 60 are intercalated in the longitudinal direction of the body stripes 3 with the portions 40 of the body stripes 3 wherein the source regions are absent. Because the elementary functional units include the elongated body stripes with source regions 60 intercalated in the longitudinal direction with body portions 40 of the body stripe, the contact of the source metal layer to both the source regions and to the body stripes is provided in the longitudinal direction. This eliminates the problems associated with the related art structure shown in FIG. 1. In particular, it is not necessary with the structure of the present invention to provide the distance "b" between the edge of the contact window 11 in the dielectric layer and the inner edge of the source regions. Therefore, the dimension Lp of the structure of the present invention is not a function of the feature size "b". Thus, with the structure of the present invention, even if the transverse dimension "a" of the contact window 11 is scaled down to the optical resolution limit of the photolithographic apparatus used for the fabrication of the MOS-gated power device, the contact of the source metal layer (not shown) to both the source regions 60 and the body region 3 of the elementary functional units is guaranteed.

With the structure and method of manufacturing of the present invention, the dimension Lp of the elongated openings 12 in the gate oxide layer 7 and the polysilicon layer 8 can be scaled down to the optical resolution limit "f" of the photolithographic apparatus used to define the openings 12 plus twice the distance "t" between the edge of the window 12 in the polysilicon layer and the edge of the contact window 11 in the dielectric layer. In other words, in the structure according to the present invention, the minimum value of Lp is f+2t. By comparison, as discussed above, the related art structure minimum value of Lp is c+2b+2t, and the dimension Lp of the elementary functional unit is determined by the three feature sizes.

Referring to FIG. 2, it can be appreciated that the channel perimeter of the MOS-gated power device is proportional to the ratio:

Lu/(Lu+s)

where Lu is a length of a source region 60 in the longitudinal direction of the body stripe 3, and "s" is the distance between two consecutive source regions 60, or in other words "s" is a length of the body portions 40 of the body stripes wherein the source regions are absent. The body portions 40 of the body stripes 3 are functionally inactive areas of the MOS-gated power device in that they do not contribute to the overall current conduction of the power device. As previously mentioned the "on" resistance Ron of the output resistance of the MOS-gated power device is inversely proportional to the overall channel perimeter of the power device, thus a smallest Ron is achieved by making "s" as small as possible and Lu as large as possible. A minimum value for "s" is given by an optical resolution limit "f" of the photolithographic apparatus, while a maximum value for Lu depends on the particular technology and voltage rating desired of the MOS-gated power device. In addition, the greater the distance Lu between two consecutive contacts to the body stripe 3 via the body regions 40, the higher the base resistance of a parasitic bipolar junction transistor that is intrinsically associated with the structure formed by the source regions 60, the body stripe 3 and the epitaxial layer 2, and the lower the maximum current that the MOS-gated power device can withstand during switching. As a consequence, the greater the distance Lu, the greater the likelihood that the MOS-gated power device cannot sustain a maximum specified voltage. Accordingly, there is a tradeoff between the Ron of the device and the maximum current capacity of the device, and the values of Lu and "s" should be selected accordingly.

In the embodiment of the present invention illustrated in FIGS. 2–4, the source regions 60 in adjacent body stripes 3 are aligned in a transversal direction of the body stripes. In other words. the source regions 60 and the body regions 40 in one body stripe are respectively aligned in the direction transverse to the length of the body regions 3 with the source regions and the body regions in the elongated body regions of the adjacent elementary functional units. In the epitaxial layer 2 between the adjacent body stripes 3 there are two current fluxes I as illustrated in FIG. 3, which run from facing source regions 60 in the adjacent body stripes 3. The distance "d" between adjacent body stripes 3 cannot therefore be reduced beyond a certain limit or Rjfet increases dramatically.

Figure 5:
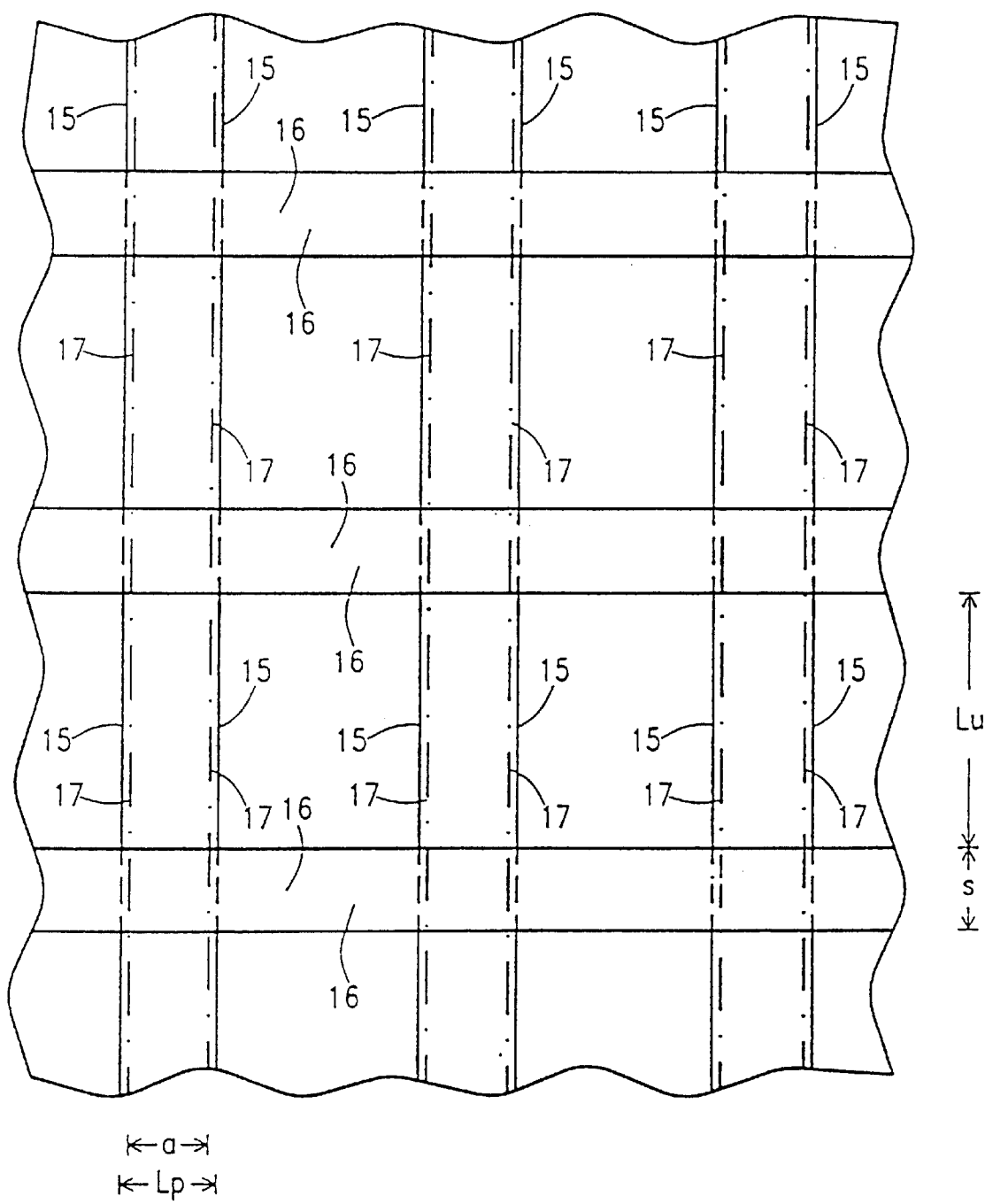
FIG. 5 is a top-plan view of the portion of MOS technology power device shown in FIG. 2, illustrating alignment of some photolithographic masks used for fabricating the device at an intermediate step of the manufacturing process.

FIG. 5 is a top-plan view illustrating the layout and the reciprocal alignment of the photolithographic masks used to fabricate the MOS-gated power device structure of the embodiment shown in FIGS. 2–4. In the figure, 15 indicates the mask for the selective etching of the polysilicon and gate oxide layers, 16 indicates the mask for the selective introduction of the dopants forming the source regions 60, and 17 (in dash-and-dot line) indicates the mask for the opening of the contact windows 11 in the dielectric layer 9.

Figure 6:
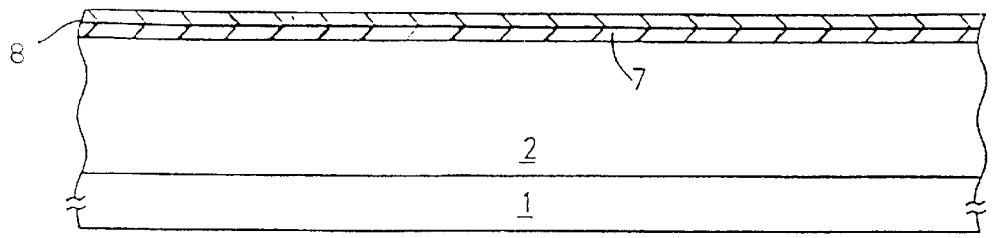
FIGS. 6–13 are cross-sectional views illustrating some of the steps of a manufacturing process of the MOS technology power device of FIG. 2.

A process for manufacturing the MOS-gated power device according to the present invention is illustrated in FIGS. 6–13. FIG. 6 illustrates the initial step of epitaxially growing the lightly doped semiconductor layer 2 over the heavily doped semiconductor substrate 1. If the power device to be formed is a power MOSFET, the substrate 1 and the epitaxial layer 2 are of the same conductivity type, whereas if an IGBT is to be fabricated, the substrate and the expitaxial layer are of opposite conductivity types. Other MOS-gated power devices may require different combinations of substrates and epitaxial layers and are intended to be within the scope of this disclosure. A resistivity and a thickness of the epitaxial layer 2 grown over the heavily doped semiconductor substrate are chosen to yield a voltage class of the power device. For example, low-voltage and high-voltage power devices usually have a respective resistivity in a range from 0.5 Ohm cm to 100 Ohm cm, and a thickness in a range from 3 $\mu$m to 100 $\mu$m. The silicon dioxide layer 7 (the gate oxide layer) is then formed over a surface of the epitaxial layer, by a thermal oxidation process. For example, the silicon dioxide can be formed by a conventional process of forming a thick oxide layer over the surface of the epitaxial layer, masking and etching of the thick oxide layer to define active areas of the MOS-gated apparatus, and forming the thin gate oxide layer over the surface of the epitaxial layer in the active areas, can be used to form the gate oxide layer 7. The polysilicon layer 8 is then formed over the gate oxide layer 7. In one embodiment, the polysilicon layer is then doped to reduce its resistivity. Alternatively, or even in addition to this step, a layer of silicide (for example cobalt silicide) can also be formed over the polysilicon layer 8 by depositing over the surface of the polysilicon layer 8 a layer of cobalt, and by performing a heating process such as submitting the device to a temperature of about 500° C. so that the cobalt and silicon react to form the silicide layer (not illustrated). An advantage of the silicide layer is that the silicide layer greatly reduces the gate resistance of the MOS-gated power device.

Figure 7:
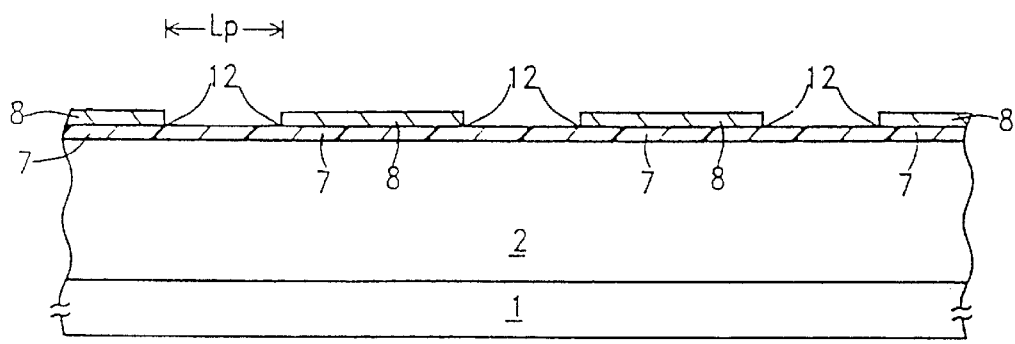

According to one embodiment of the process of manufacturing the MOS-gated power device having the body region as illustrated in FIGS. 3a and 4a, a first step for forming the central heavily doped portion of the body regions is to implant a high dose of, for example, P-type dopants through a first mask into the epitaxial layer to form the central heavily doped portions of the body regions (step not illustrated). Referring now to FIG. 7, the polysilicon layer 8 is then selectively etched by the photolithographic mask 15 (See FIG. 5) to open the elongated windows in the polysilicon layer 8 where the elementary functional units of the MOS power device will be formed. The photolithographic mask 15 is formed by depositing a photoresist layer over the polysilicon layer, selectively exposing the photoresist layer by the photolithographic mask 15 to a light source, and selectively removing the photoresistive layer from regions of the polysilicon layer which are to be etched away (steps not illustrated). It is to be appreciated that although not illustrated in FIG. 7, the gate oxide layer 7 may also be selectively etched at the same time as the polysilicon layer 8 to form the elongated windows, or in the alternative it can be etched at a later step after opening the source contact windows 11 in the dielectric layer, to be discussed below. It is apparent that the regions of the polysilicon layer 8 that are still covered by the photoresist layer are not subject to the etching described above. The lateral lightly doped portions of the body regions illustrated in FIGS. 3a, 4a are then formed by implanting through the elongated windows in the polysilicon layer a low dose of, for example P-type dopants, to form the lateral lightly doped portions of the body regions (step not illustrated).

In another embodiment of the process of manufacturing the MOS-gated power device of the present invention, having the body regions as illustrated in FIGS. 3b and 4b, the body regions having the "bowl-like" shape can be formed by one of two processes. An advantage of the body regions having the bowl-like shape is that the first mask used to implant the central heavily doped deep body region as discussed above with respect to the process for forming the body region illustrated in FIGS. 3a, 4a is not needed. In contrast, the body regions having the "bowllike" shape can be implanted into the epitaxial layer through the elongated windows in the polysilicon layer 8 using the polysilicon layer 8 as the mask.

Figure 8:
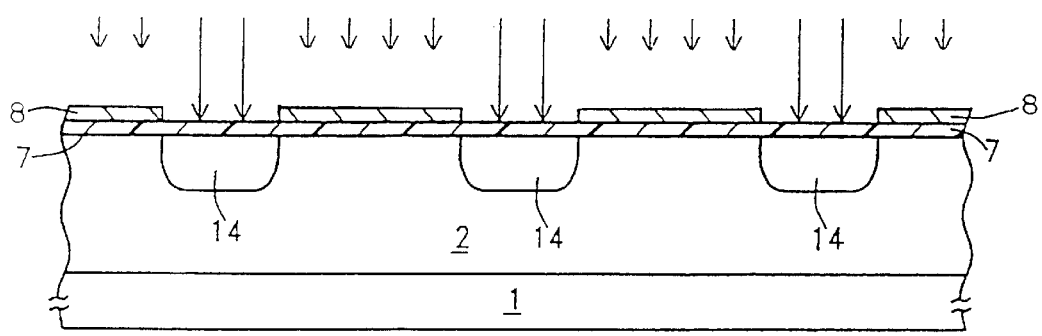

A first process of forming the body regions 3 having the "bowl-like" shape will now be described. Referring to FIG. 8, a high dose of a dopant of the second conductivity type is implanted at a high energy into the epitaxial layer 2 through the elongated openings, wherein the polysilicon layer 8 acts as an implant mask for the dopant ions. For example, boron ions can be implanted in a dose of $10^{13}$–$10^{15}$ cm$^2$ at an energy of 100–300 keV. With the high implantation energy, the regions 14 of the second conductivity type are formed in the epitaxial layer 2 wherein the distribution of the implanted ions has a peak concentration located at a prescribed distance from the surface of the epitaxial layer 2. An actual value of prescribed distance depends on the implantation energy, and preferably the implantation energy is such as to locate the peak concentration of dopants the prescribed distance into the epitaxial layer that is deeper than the source regions which will be formed in a later step to be described below. In addition, because the polysilicon layer 8 is used as the mask, the distribution of the implanted ions is laterally aligned with the edges of the window in the polysilicon layer.

Figure 9:
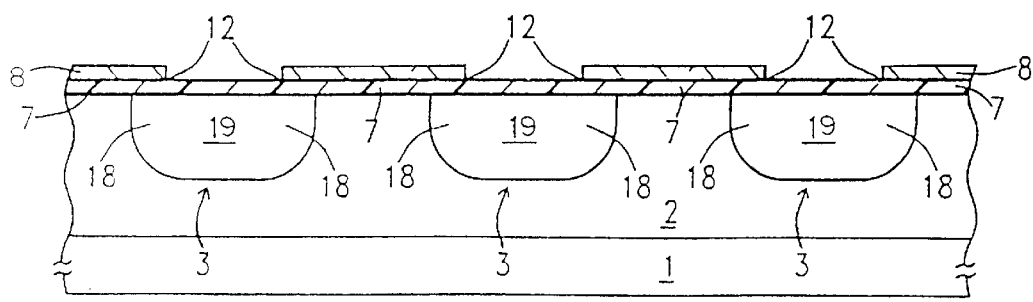

Referring now to FIG. 9, the implanted ions are then made to diffuse laterally and into the epitaxial layer by a thermal process to form the body stripes 3. The thermal process has a temperature and a time duration chosen in such a way that the body stripes 3 have a central heavily doped deep body stripe 17, which is formed by vertical diffusions of the dopants into the epitaxial layer, having elongated edges substantially aligned with the edges of the elongated openings in the polysilicon layer 8, and two lateral lightly doped channel stripes 18 laterally extending under the gate oxide layer 7, which are formed by lateral diffusion of the dopants into the epitaxial layer. A suitable thermal process can be for example at a temperature of 1050–1100° C. for 0.5 to 2 hours. Thus, the process according to this embodiment of the invention uses only one dopant implant step, does not need multiple steps, and does not need the first mask as is needed in the process of the related art.

An alternative method of forming the "bowl-like" shaped body stripes 3 involves two distinct implants of dopants of the second conductivity type into the epitaxial layer 2, in different doses and at different energies, again using the polysilicon layer 8 as the implantation mask for both of the implants. For example, a first implant can involve a dose of dopants in a range of $10^{13}$ to $10^{14}$ atoms/cm$^2$ with an energy of approximately 80 keV to provide a dopant concentration at the surface of a body stripe, for example in the channel portions. In addition, the first dopant can be used to set the desired threshold voltage of the MOS-gated power device. It is to be appreciated that although it is not needed, there may also be a thermal diffusion step between the first implant and a second implant. The second implant can then be for example, a dose of a dopant in the range of $10^{14}$ to $10^{15}$ atoms/cm$^2$ with an energy in a range between 100 keV and 300 keV, such that a peak concentration of the dopants can be located at the prescribed distance, namely at a distance deeper than the source regions which will be formed in a later step. A thermal diffusion at a temperature for example in the range from 1050–1100° C. for 0.5 to 2 hours is then performed to provide the lateral diffusion of the dopant introduced with the first implant to form the channel portions of the body stripes extending under the gate oxide layer. Any vertical diffusion of the dopant introduced with the second implant during this thermal step does not alter the threshold voltage of the MOS-gated power device, because any dopant ions that reach the surface of the epitaxial layer have a concentration lower than the concentration of the dopant introduced with the first implant, since the peak dopant concentration of the dopant introduced with the first implant is located substantially at the surface of the epitaxial layer 2. The vertical and lateral diffusion of the dopants introduced with the second implant form the heavily doped deep body regions of the body stripes, and reduce the resistivity of the body stripes under the source regions. Each of the above processes for forming the "bowl-like" body region shape have the advantages of providing the central heavily doped body strip that is selfaligned with the edges of the elongated windows, and uses one less masking step than the process of the related art structure.

Figure 10:
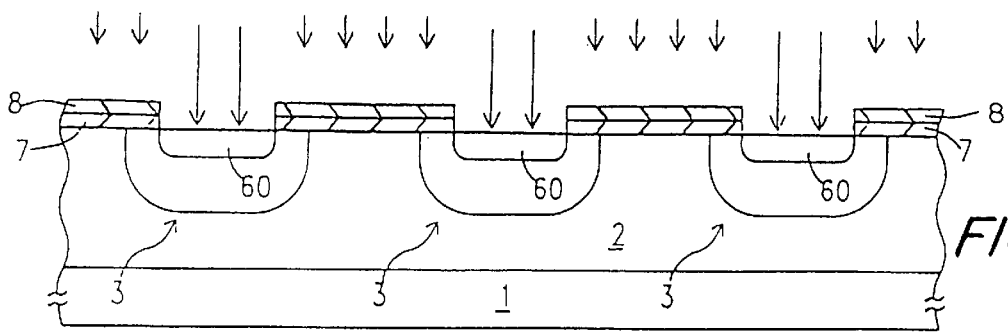
Figure 11:
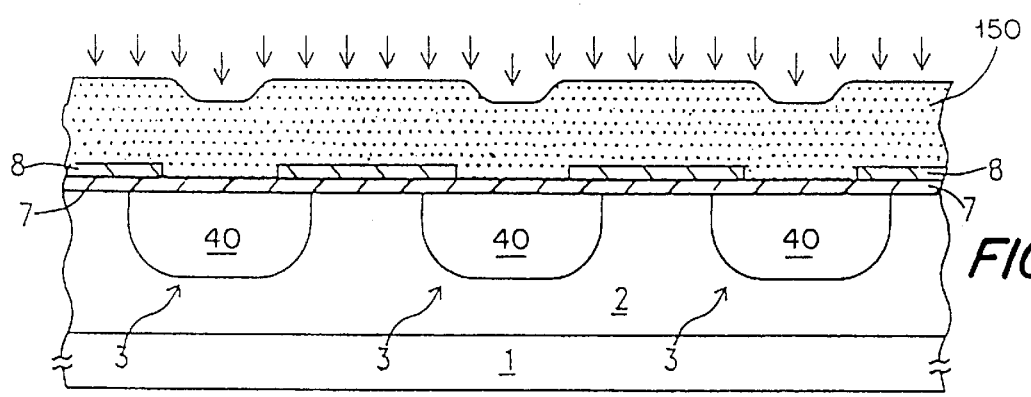

Referring now to FIGS. 10–11, which respectively show cross-sectional views of the body stripes not covered by a photoresist layer 150 and covered by the photoresist layer after the body stripes 3 have been formed by any of the above processes, dopants of the first conductivity type are selectively introduced into the body stripes in a heavy dose using the photolithographic mask 16 (See FIG. 5) to form the source regions of the power device. In particular, this step involves deposition of the photoresist layer 150 over the surface of the chip as illustrated in FIG. 11, selective exposition of the photoresist layer to a light source through the photolithographic mask 16 so that the pattern of the photolithographic mask is transferred to the photoresistive layer. The photoresistive layer is then selectively removed from the surface of the chip, to obtain the patterns of the photoresistive layer as shown in FIG. 5. The photoresistive layer acts as implantation mask for dopants of the first conductivity type as shown in FIG. 11. With these steps, the source regions 60 are formed in the body regions 3 as illustrated in FIG. 10 and are intercalated in the longitudinal direction of the body stripes with the portions 40 of the body stripes as illustrated in FIG. 11.

It is to be appreciated that the source regions within each body region, can also be formed by using a silicon etching step to etch portions of a source region diffused in the body region. For example, the source region may be implanted as an elongated stripe within the elongated body region. The body portions of the body region can then be formed by etching through the source stripe to the underlying body region to provide the plurality of body portions and source regions within the body region.

One advantage of the process of manufacturing the MOS-gated power device according to the present invention is that should a misalignment exists between the photolithographic mask 16 used for defining pattern of the photoresistive layer 150 and the photolithographic mask 15 used for defining the elongated openings in the polysilicon layer 8, the misalignment does not have any effect on the final structure because the source region 60 will be intercalated in the longitudinal direction of the body regions with the body portions 40 of the body regions. In other words, the transverse dimension of the structure of the present invention is not being relied upon to establish connection of the metal layer 10 to each of the source region and the body region. Instead the longitudinal dimension is used to provide these contacts.

Another advantage of the process and structure of the present invention is that the processing step for forming the "bowl-like" body region of the present invention does not need the mask for the formation of the deep body region portion, as required in the process of the related art. In particular, as discussed above, the related art requires a first mask internal to the openings 12 in the polysilicon layer, that is used to introduce the high dose of dopants into the semiconductor layer to form the central portion of the deep body regions while avoiding lateral diffusion of the dopants in the channel regions and a second mask (the elongated windows) in the polysilicon layer for implanting the low dose of dopants to form the lateral lightly doped regions. In contrast, the polysilicon layer is used as the mask for introducing the dopants to create the body regions according to the present invention, and no other mask is needed.

Figure 12:
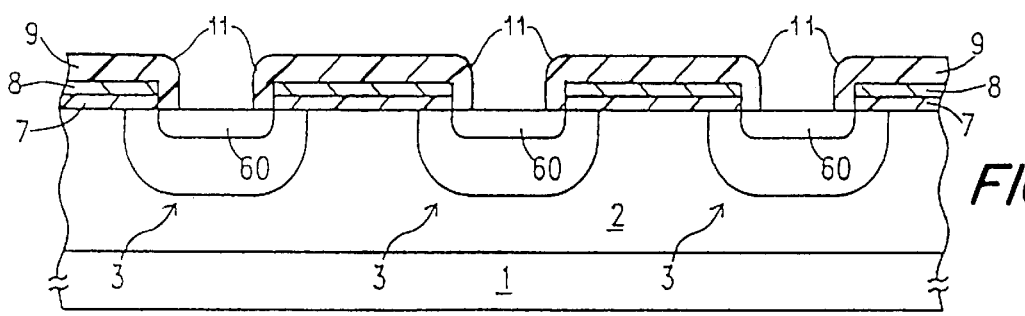
Figure 13:
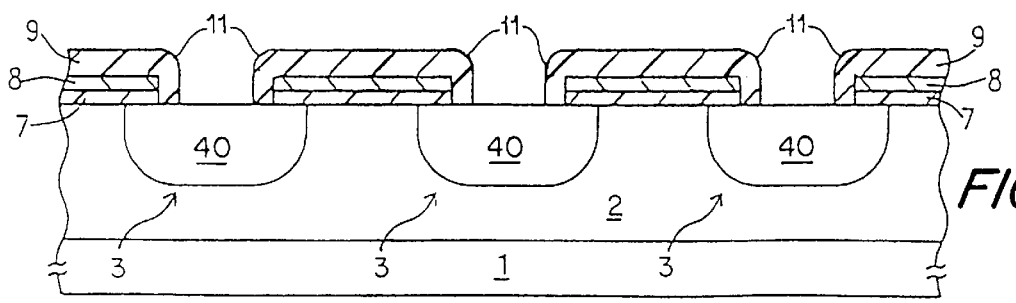

Referring now to FIGS. 12–13, which illustrate the cross-sectional views of FIGS. 3*b*, and 4*b* respectively, there is illustrated the body regions 3 containing the source portions 60 and the body portions, respectively. The photoresist layer 150 is removed. In addition, it is to be appreciated that if the underlying gate oxide layer 7 had not been removed simultaneously with the polysilicon gate layer 8 as discussed above, then the underlying gate oxide layer is then removed simultaneously with the photoresistive layer. The dielectric layer 9, such as for example an oxide layer formed by a chemical vapor deposition and doped with P-type dopants (known as "PVAPOX") is then deposited over the substrate and selectively etched using the photolithographic mask 17 (See FIG. 5) to form the contact windows 11 in the dielectric layer 9. The metal layer (not shown) is then deposited over the dielectric layer 9 and it is selectively removed to define the source electrode of the MOS power device.

Figure 14:
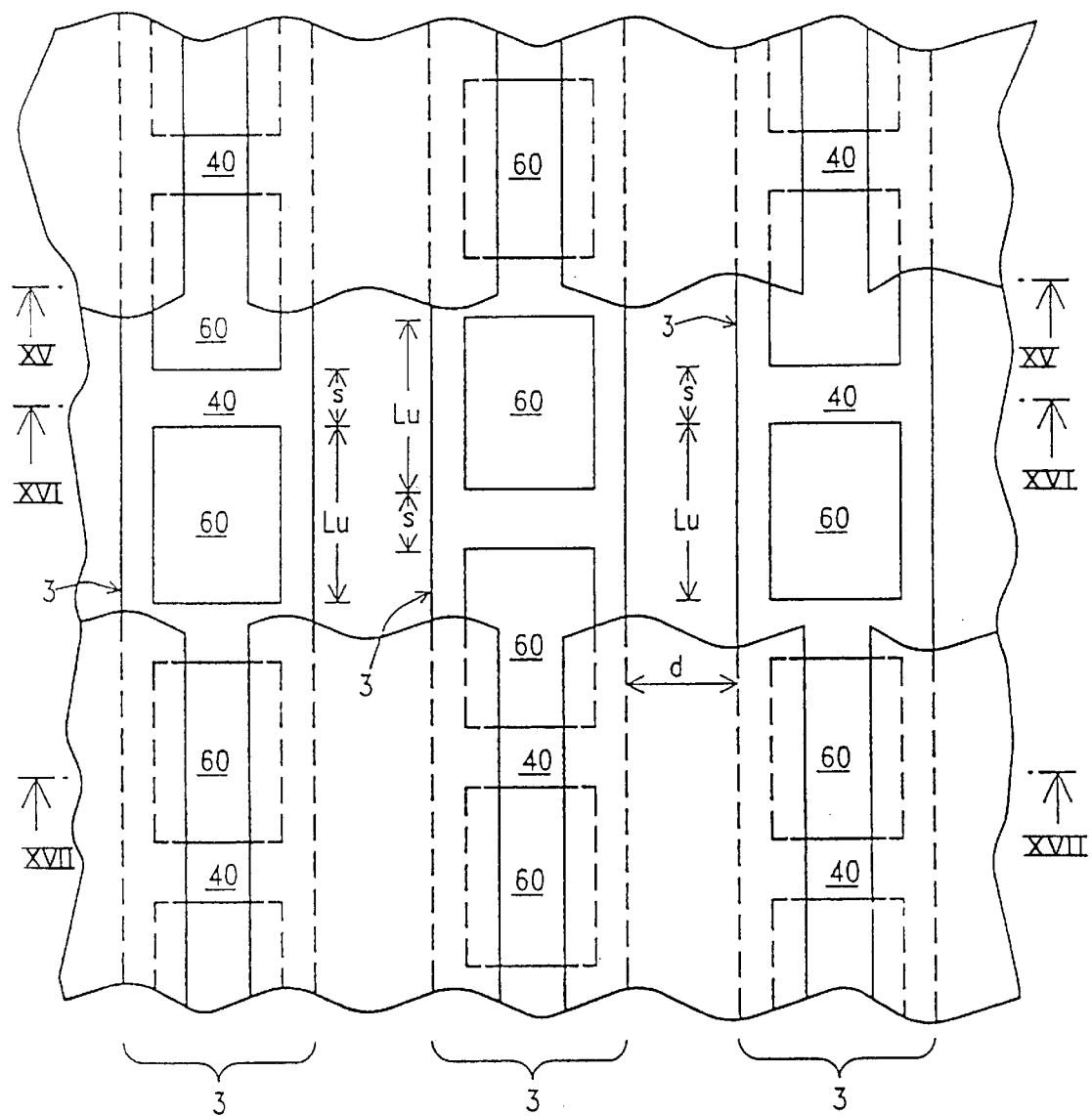
FIG. 14 is a top-plan view of a portion of MOS technology power device according to a second embodiment of the present invention.
Figure 15:
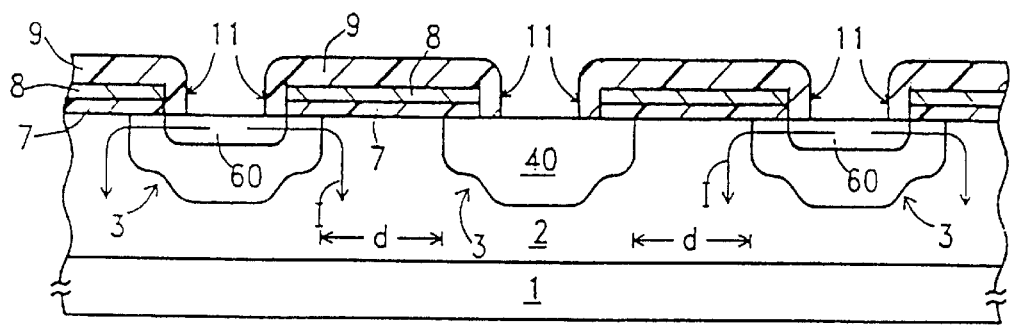
FIG. 15 is a cross-sectional view along line XV—XV in FIG. 14.
Figure 16:
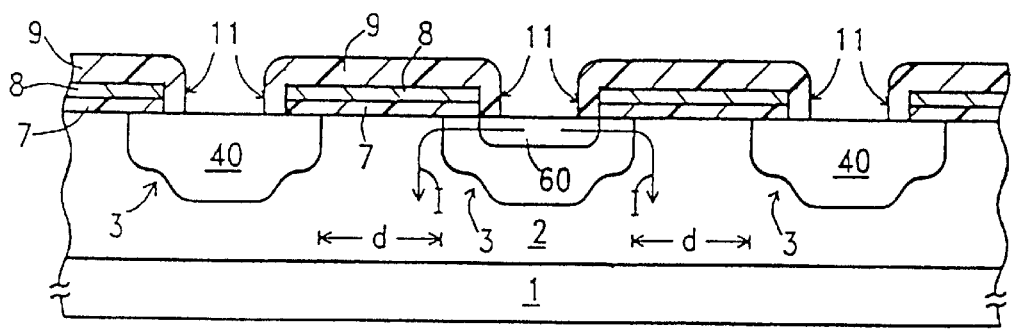
FIG. 16 is a cross-sectional view along line XVI—XVI in FIG. 14.
Figure 17:
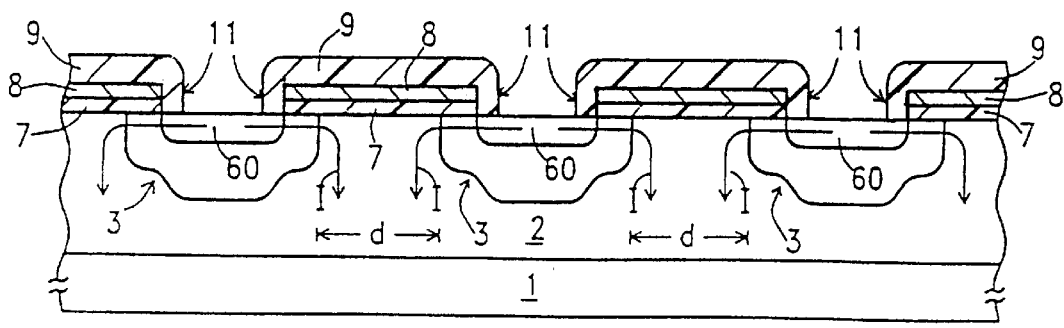
FIG. 17 is a cross-sectional view along line XVII—XVII in FIG. 14.

FIG. 14 is a top-plan view of a portion of a MOS-gated power device according to a second embodiment of the present invention. FIGS. 15, 16 and 17 illustrate cross-sectional views of the epitaxial layer 2 taken along lines XV—XV, XVI—XVI, and XVII—XVII, respectively. This embodiment is substantially similar to that of FIG. 2, except that the source regions 60 in a given body stripe 3 are shifted in the longitudinal direction with respect to the source regions 60 in the adjacent body stripes 3. With the structure of this embodiment, as illustrated in the cross-sectional views of FIGS. 15, 16 and 17, there are portions of the epitaxial layer 2 between adjacent body stripes 3 wherein there is only one current flux I running either from the source region 60 of one body stripe 3 or from the source region 60 of an adjacent body stripe 3. With this arrangement, it is possible to slightly reduce the distance "d" between the body stripes 3 without increasing the resistance component Rjfet between depletion regions of the elementary functional units, which contributes to the overall resistance of the Ron. The increased integration density provides an increase of the overall channel perimeter per unit area. However, since as discussed above in order to maximize the channel perimeter of the device the dimension s should be small compared with the dimension Lu, any reduction in the distance "d" should also should be small, because the majority of portion of the epitaxial layer 2 between the body stripes 3 will have a current flow of two current fluxes I as illustrated in the cross-sectional view of FIG. 17.

The MOS-gated power device according to this second embodiment can be fabricated using the same manufacturing process described above. In addition, it is to be appreciated that although FIGS. 14–17 illustrate the body stripes 3 as having a central deep heavily doped body region and lightly doped lateral regions to form the shape as illustrated in the cross-sectional views of FIGS. 3a and 4a, the body regions may also be formulated with the "bowl-like" shape as illustrated in FIGS. 3b and 4b.

Figure 18:
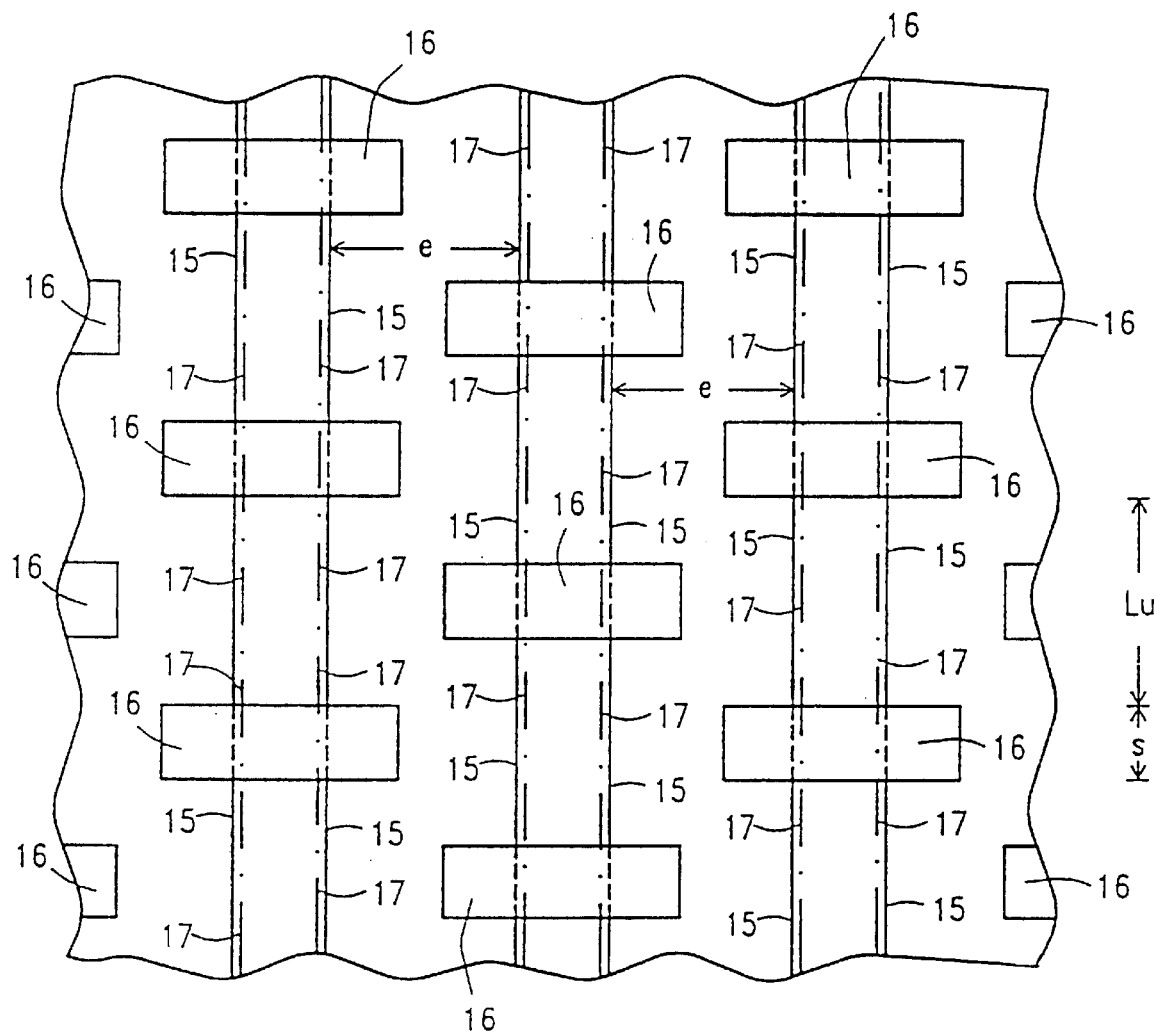
FIG. 18 is a top-plan view of the portion of MOS technology power device shown in FIG. 14, illustrating alignment of some photolithographic masks used for fabricating the device at an intermediate step of the manufacturing process.

FIG. 18, similar to FIG. 5, is a top-plan view illustrating the layout and the reciprocal alignment of the photolithographic masks used to form the MOS-gated power device structure according to this second embodiment. In FIG. 18, reference numeral 15 indicates the mask for the selective etching of the polysilicon layer 8, 16 indicates the mask for the selective introduction of the dopants forming the source regions 60, and 17 (in dash-and-dot line) indicates the mask for the opening of the contact windows 11 in the dielectric layer 9. To take into account any alignment tolerances of the photolithographic apparatus, a distance e between the windows 12 in the polysilicon layer should be larger than twice an alignment tolerance Lt of the photolithographic apparatus, to prevent a misalignment in the transverse direction between the mask 15 and the mask 16. However, this does not adversely affect the reduction in size achieved with the present invention because the alignment tolerance of a photolithographic apparatus is normally smaller (approximately ¼) than the optical resolution limit "f" of the photolithographic apparatus, and the dimension "e" is normally larger than the optical resolution limit "f" of the photolithographic apparatus. For example, using a stepper photolithographic apparatus with an optical resolution "f" approximately equal to 1 $\mu$m, the alignment tolerance is approximately 0.3 $\mu$pm.

With each of the first two embodiments illustrated in FIGS. 2–4 and 14–17 it is possible to obtain, with the same manufacturing processes already in use, low-voltage MOS-gated power devices with 1200–4000 cm of channel perimeter per $cm^2$ of active area depending on the photolithographic apparatus in use and depending on process parameters such as the channel length. This channel perimeter per active area density is equivalent to a cellular MOS-gated power device with a cell density ranging from 1.2 to 10 millions cells per square inch.

Figure 19:
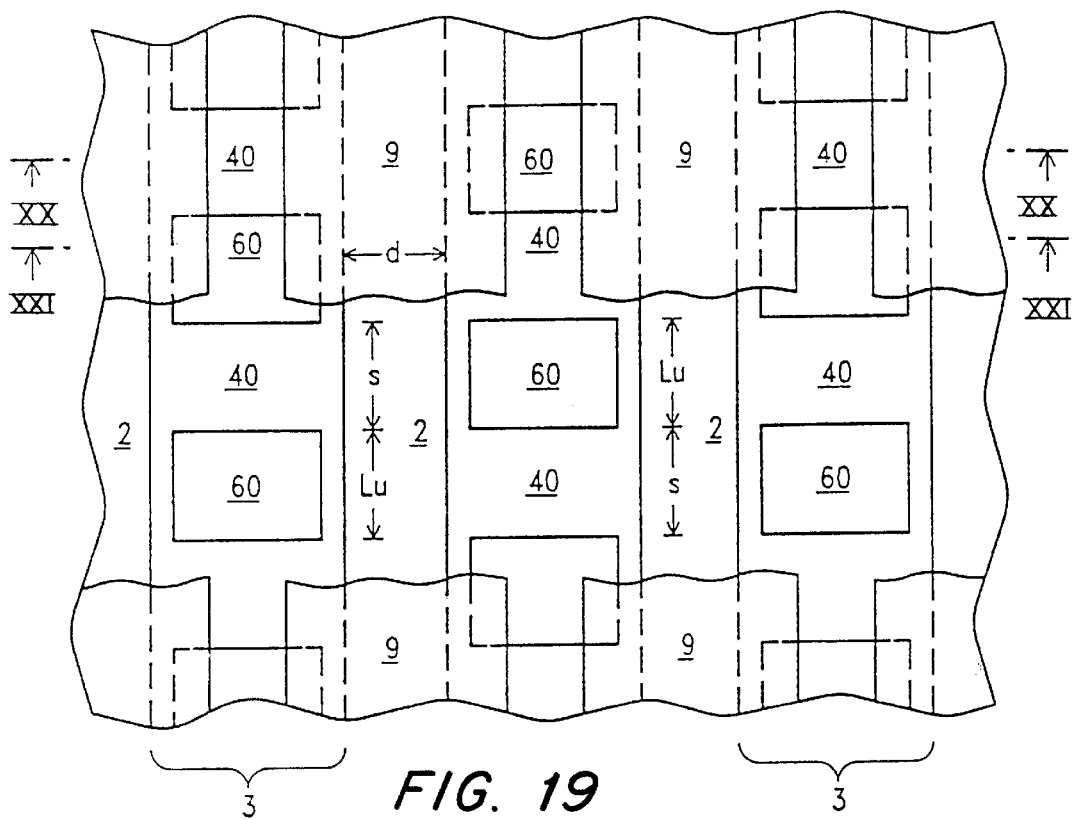
FIG. 19 is a top-plan view of a portion of MOS technology power device according to a third embodiment of the present invention.

FIG. 19 is a top-plan view of a portion of a MOS-gated power device according to a third embodiment of the invention. In this embodiment the length "s" of the body portions 40 of the body stripes 3 wherein the source regions 60 are absent is the same length as the length Lu of the source regions 60. The channel perimeter for a single elementary functional unit is therefore approximately one half of that achievable with the structures of the previous two embodiments. However, this embodiment has an advantage for example with respect to the embodiment of FIGS. 2–4, in that the distance "d" between adjacent body stripes 3 can be reduced to one half. This reduction in the distance "d" is possible because the source regions 60 of a given body stripe 3 always face the body portions 40 of the adjacent body stripes 3. As illustrated in the cross-sectional views of FIGS. 20–21, which are taken along lines XX—XX and XXI—XXI of FIG. 19 respectively, the portions of the epitaxial layer 2 between the body stripes 3 are always intersected by a current flux I coming from only one source region. An advantage of this embodiment of the present invention is that the reduction of the distance "d" between the body stripes 3 leads to a lowering of the feedback capacitance of the MOS-gated power device, because the area between the polysilicon layer 8 and the common drain layer 2 is reduced in half. This is of great benefit for the dynamic performance of the device. It is also to be appreciated that the reduction of the distance "d" between adjacent elementary functional units provides an increase of the integration density, and thus an overall channel perimeter per unit area of this embodiment is higher than that achievable with structures of the previous two embodiments.

The MOS-gated power device according to this third embodiment of the invention can be fabricated by the manufacturing process previously described. In addition, it is to be appreciated that although FIGS. 19–23 illustrate the third embodiment as having the shape as shown in FIGS. 3a and 4a, the body regions can also have the "bowl-like" body shape as illustrated in FIGS. 3b and 4b.

Figure 22:
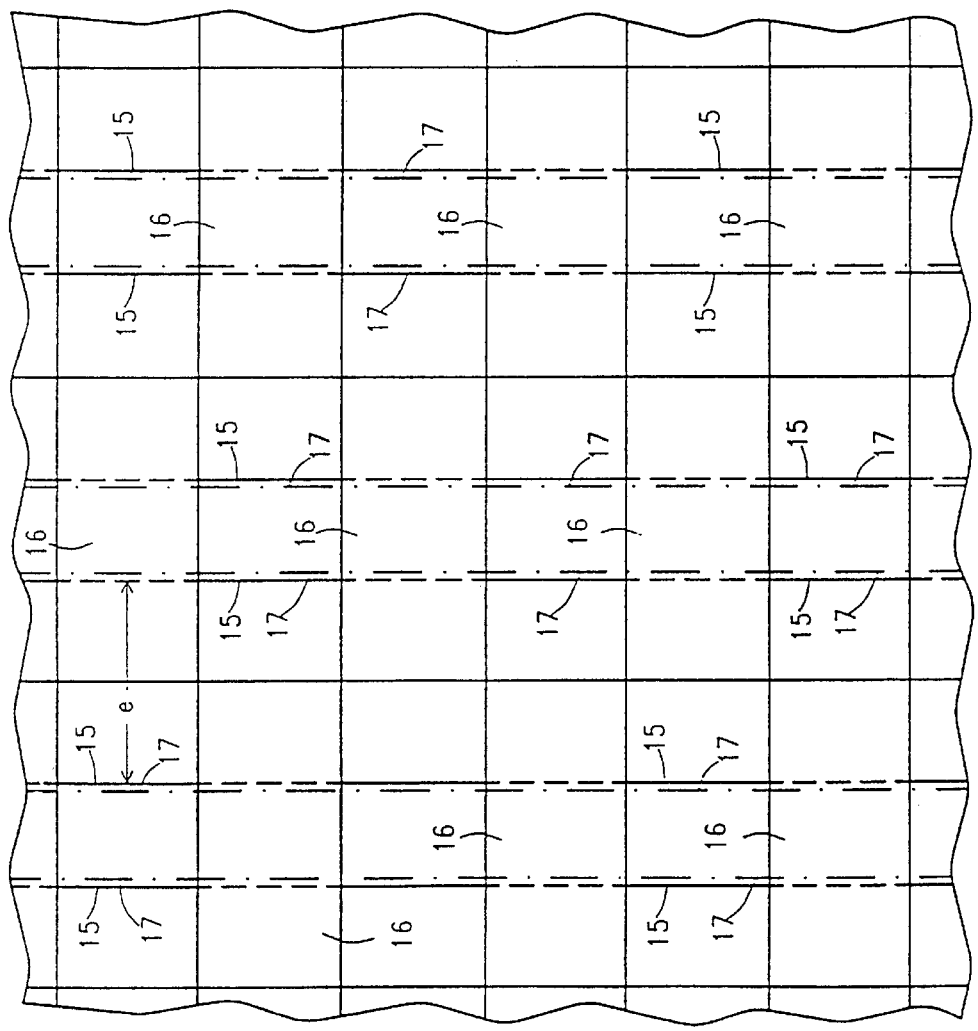
FIG. 22 is a top-plan view of the portion of MOS technology power device shown in FIG. 19, illustrating alignment of some photolithographic masks used for fabricating the device at an intermediate step of the manufacturing process.

FIG. 22 is analogous to FIGS. 5 and 18, and is a top-plan view showing the layout and the reciprocal alignment of the photolithographic masks used to fabricate the structure of FIG. 19. Again, the mask for the selective etching of the polysilicon layer is indicated with reference numeral 15, the mask for the selective introduction of the dopants for the source regions 60 is indicated with 16, and the mask for the opening of the contact windows 11 is indicated with 17 (in dash-and-dot lines). As in the case of the second embodiment and as illustrated in FIG. 18, the distance "e" between adjacent elongated windows 12 in the polysilicon layer 8 should be greater than twice the alignment tolerance Lt of the photolithographic apparatus in use, to take into account the possible alignment errors between the mask 15 and the mask 16. However, as discussed above, this does not adversely affect the reduction in size achieved with this embodiment because as already mentioned the alignment tolerance Lt is approximately ¼ of the optical resolution limit. In addition, even though this embodiment allows a significant reduction of the distance "d" between adjacent body stripes, the dimension "e" is larger than the optical resolution limit of the photolithographic apparatus.

Figure 23:
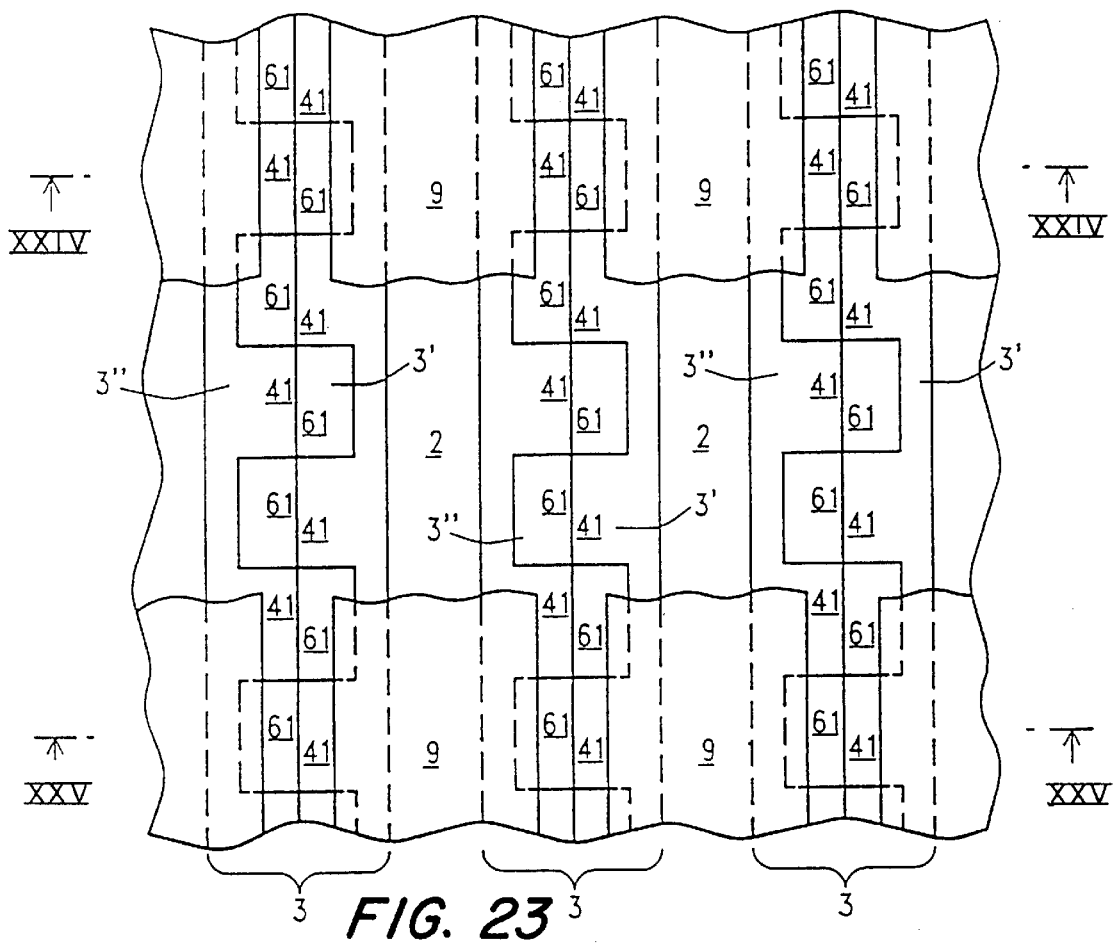
FIG. 23 is a top plan view of a portion of MOS technology power device according to a fourth embodiment of the present invention.

FIG. 23 is a top-plan view of a portion of a MOS-gated power device according to a fourth embodiment of the invention. In this embodiment, each body stripe 3 is divided into two longitudinal half-stripes 3' and 3", and in each half-stripe source regions 61 of the opposite conductivity type of the body stripe 3 are intercalated in the longitudinal direction with body portions 41 of the half-stripe wherein the source regions are absent. In addition, the source regions 61 in one half-stripe are contiguous to the body portions 41 of the other half-stripe, and face the body portions 41 of adjacent body stripes 3.

Figure 20:
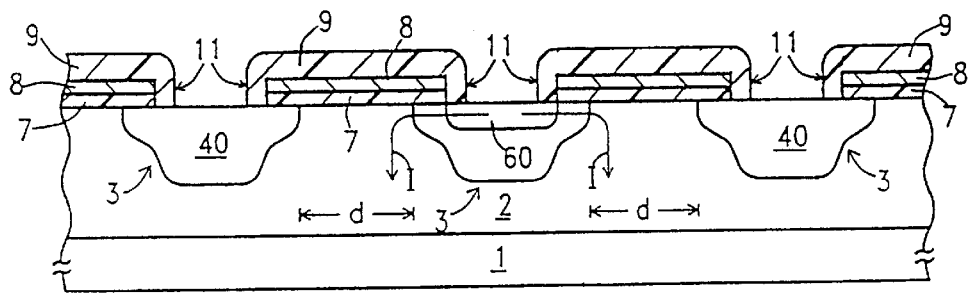
FIG. 20 is a cross-sectional view along line XX—XX in FIG. 19.
Figure 21:
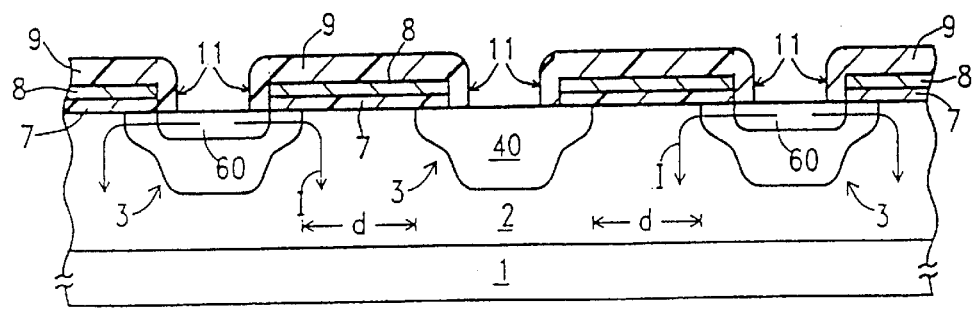
FIG. 21 is a cross-sectional view along line XXI—XXI in FIG. 19.
Figure 24:
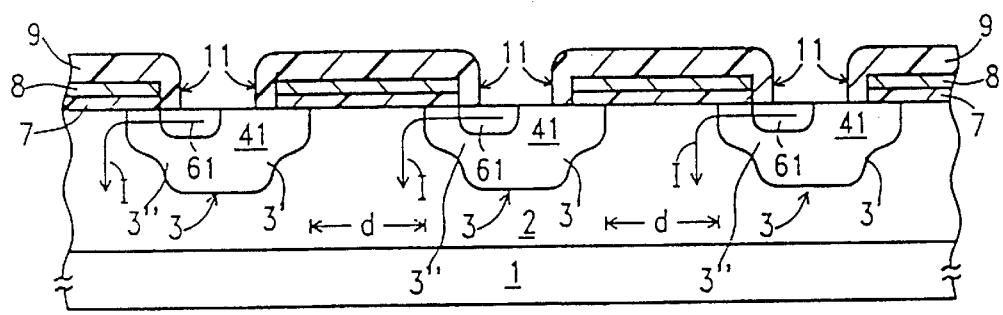
FIG. 24 is a cross-sectional view along line XXIV—XXIV in FIG. 23.
Figure 25:
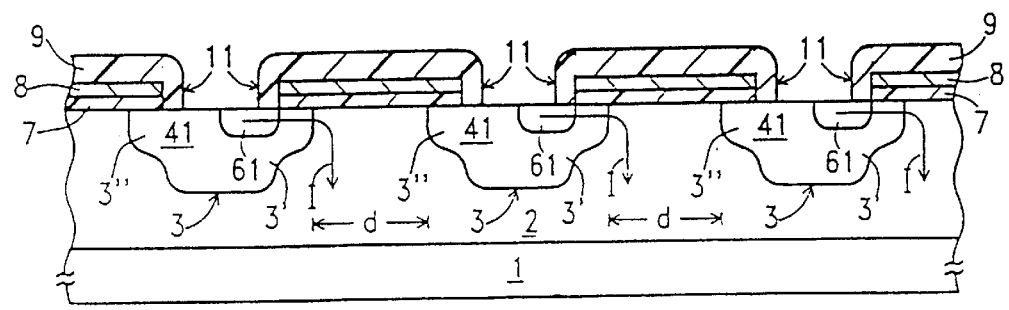
FIG. 25 is a cross-sectional view along line XXV—XXV in FIG. 23.

As is the case with the structure illustrated in FIGS. 19–21, the arrangement of this embodiment allows a reduction in the distance "d" between adjacent body stripes, because the portions of the epitaxial layer 2 between the adjacent body stripes 3 are always interested by a current flux I from only one source portion. FIGS. 24 and 25 are cross-sectional view taken along lines XXIV—XXIV and XXV—XXV of FIG. 23, respectively, and illustrate the single current flux I in the epitaxial layer.

An advantage of this embodiment with respect to the previous three embodiments is that the source metal layer 10 (not shown) contacts the body stripes 3 and the source regions 61 along their whole length, instead of at regularly spaced intervals having the length equal to Lu. This results in an increased ruggedness of the MOS-gated power device. For example, a base-emitter resistance of a parasitic bipolar junction transistor associated with the structure formed by the source regions, the body stripes and the epitaxial layer is minimized.

The MOS-gated power device according to this third embodiment of the invention can be fabricated by the same manufacturing process previously described. In addition, it is to be appreciated that although FIGS. 24–25 illustrate the fourth embodiment as having the shape as shown in FIGS. 3a and 4a, the body regions can also have the "bowl-like" body region shape as illustrated in FIGS. 3b and 4b.

Figure 26:
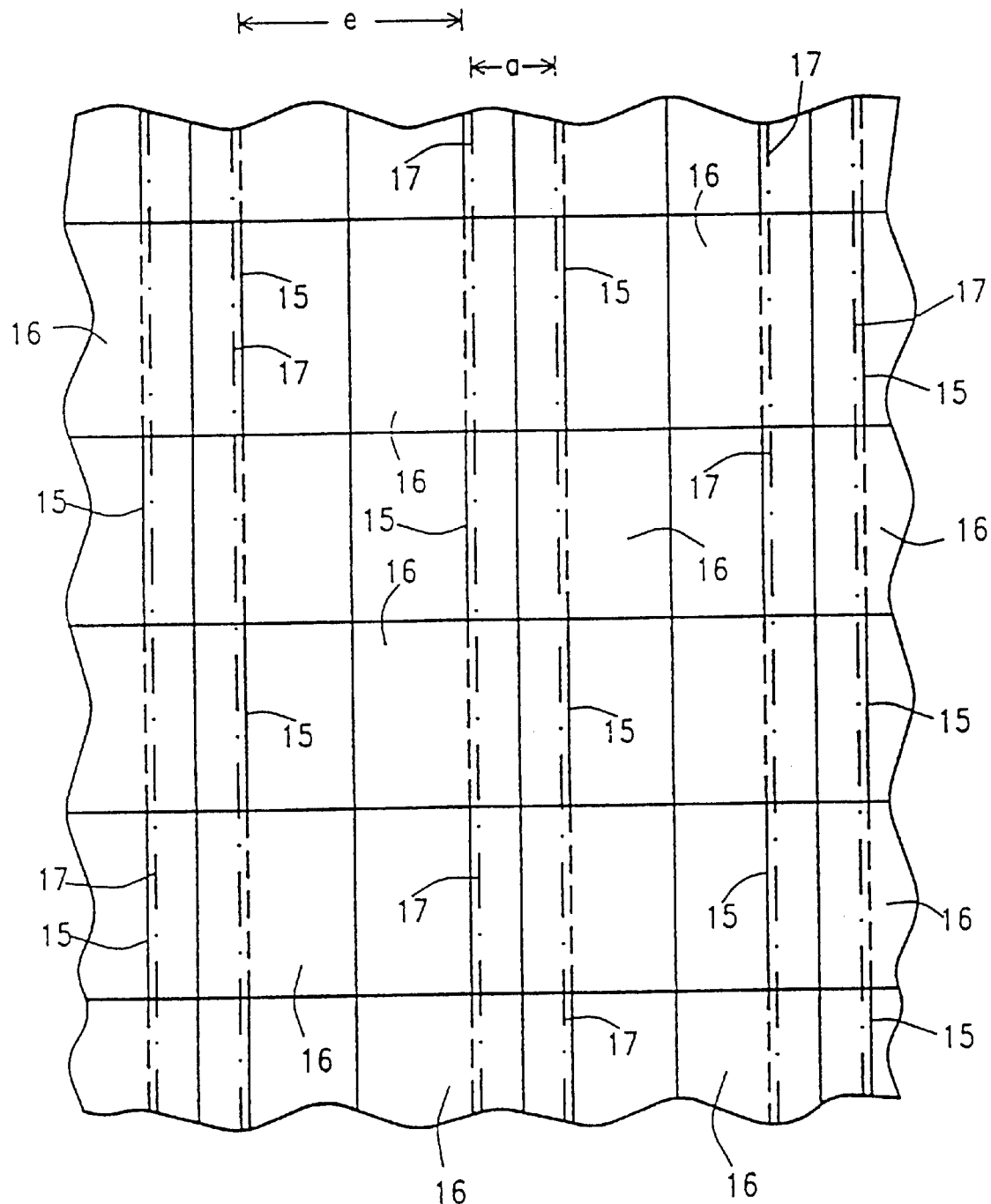
FIG. 26 is a top-plan view of the portion of MOS technology power device shown in FIG. 23, illustrating alignment of some photolithographic masks used for fabricating the device at an intermediate step of the manufacturing process.

FIG. 26 is analogous to FIGS. 5, 18 and 22, and is a top-plan view showing the layout and the reciprocal alignment of the photolithographic masks used to fabricate the structure of FIG. 23. Again, reference numeral 15 indicates the mask for the selective etching of the polysilicon layer 8, 16 indicates the mask for the formation of the source regions 61, and 17 (in dash-and-dot lines) indicates the mask for the opening of the contact windows 11 in the dielectric layer 9. It can be appreciated that the layout of the three masks is substantially the same as that of FIG. 22, the only difference for this embodiment not only should the distance "e" between adjacent elongated windows 12 in the polysilicon layer be greater than twice the alignment tolerance Lt of the photolithographic apparatus in use, but also the dimension "a" of the contact window should be greater than 2Lt, to prevent any alignment errors between mask 15 and mask 16 yielding an incorrect layout. However, since the minimum value for dimension "a" is the optical resolution limit of the photolithographic apparatus, and since the alignment tolerance Lt is approximately ¼ the optical resolution limit, the possibility of alignment errors between masks 15 and 16 does not pose a limit to shrinking the transverse dimension of the elementary functional units with this embodiment. An advantage of this embodiment of the present invention is that the contact of the source metal layer (not shown) to the source regions 61 and to the body portions 41 is guaranteed even if the dimension "a" of the elongated contact window 11 is reduced to the optical resolution limit of the photolithographic apparatus.

Figure 27:
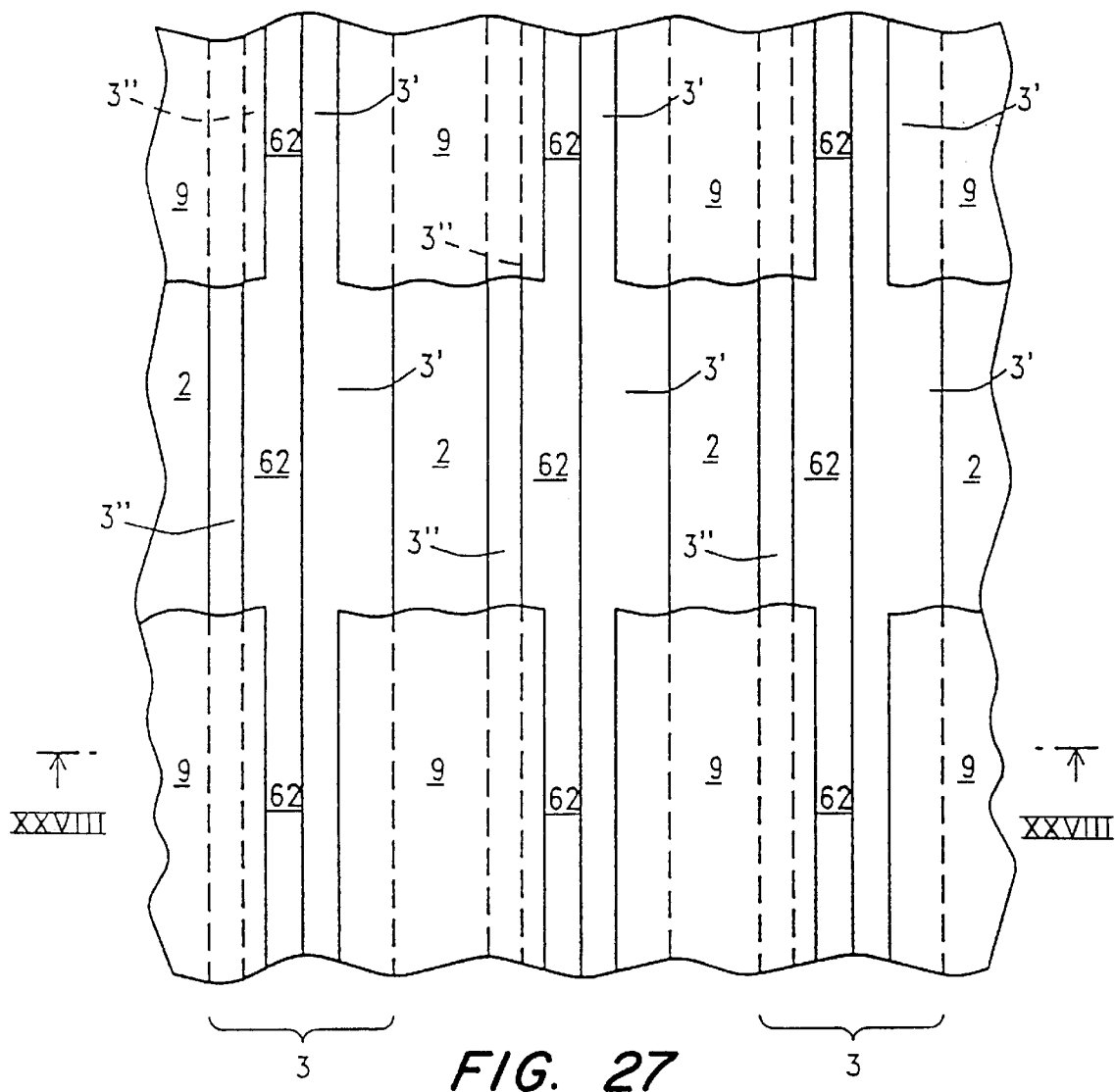
FIG. 27 is a top-plan view of a portion of MOS technology power device according to a fifth embodiment of the present invention.
Figure 28:
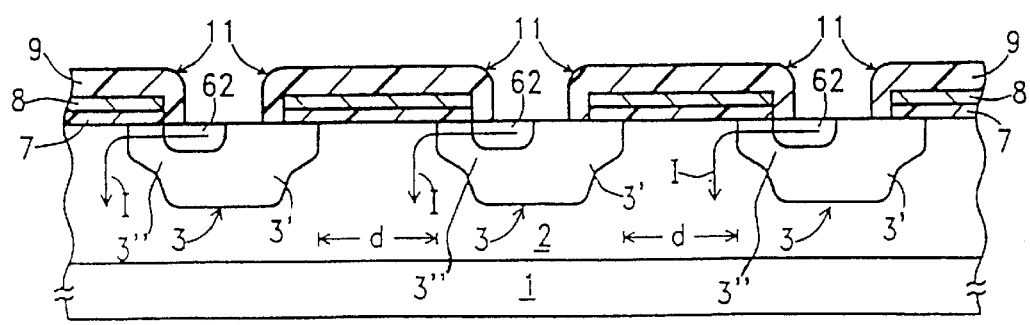
FIG. 28 is a cross-sectional view along line XXVIII—XXVIII in FIG. 27.

FIG. 27 is a top-plan view of a MOS-gated power device according to a further embodiment of the present invention. As in the case of the embodiment illustrated in FIG. 23, each body stripe 3 is divided in two half-stripes 3' and 3". In a first half-stripe of the two half-stripes a source region 62 is provided that extends substantially for an entire length of the body stripe 3, while in a second half-stripe no source region is provided. FIG. 28 is a cross-sectional view taken along line XVIII—XVIII of FIG. 27. As illustrated in FIG. 28 and as discussed above with the arrangement of FIG. 23–25, it is possible with this embodiment to reduce the distance "d" between adjacent body stripes, because in the portions of the drain layer 2 between adjacent body stripes there is a current flux I coming from only source region. In addition, as discussed above with respect to the fourth embodiment, an advantage of this embodiment is an increased ruggedness of the MOS-gated power device, because the body stripe 3 and the source region 62 are contacted by the source metal layer along the entire length. It is to be appreciated that although FIGS. 27–28 illustrate this embodiment as having the shape as shown in FIGS. 3a and 4a, the body regions can also have the "bowl-like" body region shape as illustrated in FIGS. 3b and 4b.

Figure 29:
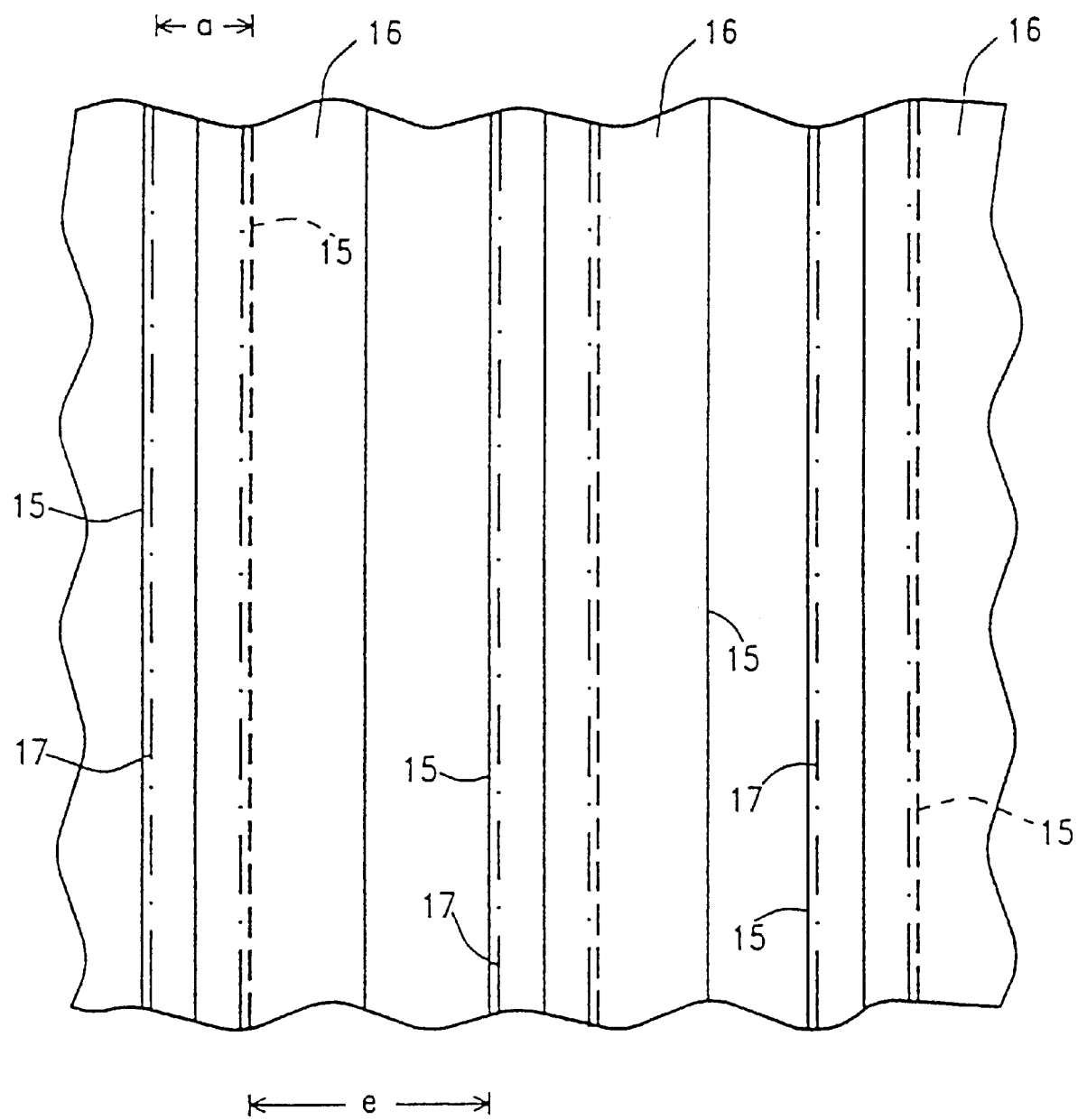
FIG. 29 is a top-plan view of the portion of the MOS technology power device of FIG. 27 illustrating alignment of some photolithographic masks used for fabricating the device at an intermediate step of the manufacturing process.

FIG. 29 is a top-plan view showing the layout and the reciprocal alignment of the photolithographic masks used to form the structure of FIGS. 27–28. The same reference numerals as used in FIGS. 5, 18, 22 and 26 have been used to illustrate the masks in FIG. 29. This embodiment of the invention can be fabricated with the same manufacturing process previously described. The only difference is the layout of the source mask, which results in the pattern of photoresist 15 shown in FIG. 29. As discussed above with respect to the fourth embodiment, for this embodiment the distance "e" between adjacent elongated openings in the passivation and polysilicon layers 9 and 8, and the dimension Lp of the elongated openings 12 should be at least twice the alignment tolerance Lt of the photolithographic apparatus in use, to prevent layout errors due to the alignment errors between the source mask and the mask for defining the elongated openings 12.

In summary, the embodiments illustrated in FIGS. 23–25 and 27–28 are better from the point of view of the ruggedness of the MOS-gated power device, but are more critical than the first three embodiments from the point of view of the alignment of the source mask with the mask for defining the elongated openings 12 in the passivation layer 9. In particular, for the fourth and fifth embodiments the source mask should be aligned within the dimension Lp of the elongated opening 12. This means that the dimension Lp should be sufficient to provide for simultaneous contact to two different regions. In other words, the dimension Lp should be larger than twice the alignment tolerance Lt of the photolithographic apparatus. However, as already mentioned, the requirement of this alignment between the masks does not prevent the objective of shrinking the dimension Lp of the elongated opening 12 to the optical resolution limit of the photolithographic apparatus, since the alignment tolerance Lt is always significantly smaller than the optical resolution limit.

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A MOS technology power device comprising:
    a semiconductor material layer of a first conductivity type;
    a first insulating material layer above the semiconductor material layer;
    a conductive material layer above the first insulating material layer;
    a plurality of elementary functional units, each elementary functional unit including:
        an elongated body region of a second conductivity type formed in the semiconductor material layer and having a length;
        a first elongated window in the first insulating material layer and the conductive material layer above the elongated body region, having a length along the length of the elongated body region, and having a plurality of elongated edges in the first insulating material layer and the conductive material layer;
        a source region of the first conductivity type disposed in the elongated body region along the length of the elongated body region;
    a second insulating material layer disposed above the conductive material layer and at each elongated edge of the first elongated window, having a second elongated window disposed therein along the length of the elongated body region;

a metal layer disposed above the second insulating material layer, contacting a body portion of the elongated body region wherein no dopant of the first conductivity type is provided and the source region through the second elongated window along the length of the elongated body region;

wherein each source region includes a plurality of source portions of the first conductivity type having a length along the length of the elongated body region and intercalated along the length of the elongated body region with body portions of the elongated body region wherein no dopants of the first conductivity type are provided, the body portions having a length along the length of the elongated body region; and wherein the length of the source portions is greater than the length of the body portions.

2. The MOS technology power device according to claim 1, wherein the source portions and the body portions of the elongated body region are substantially aligned in a direction transverse to the longitudinal direction of the elongated body region, respectively with the source portions and the body portions in body regions of adjacent elementary functional units.

3. The MOS technology power device according to claim 1, wherein the source portions and the body portions of the body region are substantially shifted in the longitudinal direction with respect to the source portions and the body portions in body regions of adjacent elementary functional units.

4. A MOS technology power device comprising:

a semiconductor material layer of a first conductivity type;

a first insulating material layer above the semiconductor material layer;

a conductive material layer above the first insulating material layer;

a plurality of elementary functional units, each elementary functional unit including:

an elongated body region of a second conductivity type formed in the semiconductor material layer and having a length and a width;

a first elongated window in the first insulating material layer and the conductive material layer above the elongated body region, having a length along the length of the elongated body region and a width, and having a plurality of elongated edges in the first insulating material layer and the conductive material layer;

a source region of the first conductivity type disposed in the elongated body region along the length of the elongated body region;

a second insulating material layer disposed above the conductive material layer and at each elongated edge of the first elongated window, having a second elongated window disposed therein along the length of the elongated body region;

a metal layer disposed above the second insulating material layer, contacting a body portion of the elongated body region wherein no dopant of the first conductivity type is provided and the source region through the second elongated window along the length of the elongated body region; and wherein each source region includes a plurality of source portions of the first conductivity type having a length along the length of the elongated body region and intercalated along the length of the elongated body region with body portions of the elongated body region wherein no dopants of the first conductivity type are provided, the body portions having a length extending along the length of the elongated body region, wherein the length of the sources portions is substantially equal to the length of the body portions and a width of the source portions is greater than the width of the second elongated window in the second insulating material layer so that the source portions contact the metal layer through substantially the entire width of the second elongated window in the second insulating material layer.

5. The MOS technology power device according to claim 4, wherein the source portions and the body portions of the elongated body region are substantially aligned in a direction transverse to the longitudinal direction, respectively, with the body portions and the source portions of elongated body regions in adjacent elementary functional units.

6. A MOS technology power device comprising:

a semiconductor material layer of a first conductivity type;

a first insulating material layer above the semiconductor material layer;

a conductive material layer above the first insulating material layer;

a plurality of elementary functional units, each elementary functional unit including:

an elongated body region of a second conductivity type formed in the semiconductor material layer and having a length;

a first elongated window in the first insulating material layer and the conductive material layer above the elongated body region, having a length along the length of the elongated body region and having a plurality of elongated edges in the first insulating material layer and the conductive material layer;

a source region of the first conductivity type disposed in the elongated body region along the length of the elongated body region;

a second insulating material layer disposed above the conductive material layer and at each elongated edge of the first elongated window, having a second elongated window disposed therein along the length of the elongated body region;

a metal layer disposed above the second insulating material layer, contacting a body portion of the elongated body region wherein no dopant of the first conductivity type is provided and the source region through the second elongated window along the length of the elongated body region; and wherein the elongated body region comprises a first longitudinal half-stripe and a second longitudinal half-stripe, each longitudinal half-stripe having a length along the length of the elongated body region and merged together along a longitudinal edge of the first longitudinal half-stripe and the second longitudinal half-stripe, each longitudinal half-stripe including a plurality of source portions of the first conductivity type intercalated along the length of each half-stripe with body portions of the half-stripe wherein no dopants of the first conductivity type are provided, the source portions and the body portions of the first longitudinal half-stripe being respectively aligned in a direction transverse to the length of the first longitudinal half-stripe with the body portions and the source portions, respectively, of the second longitudinal half-stripe so that at least one corner of each source portion along the elongated edge of the first half-stripe touches a corner of a source portion of the second half-stripe.

7. The MOS technology power device according to claim 6, wherein the source portions in each half stripe are substantially aligned in the transverse direction with the source regions in each corresponding half-stripe of the body stripes of adjacent elementary functional units.

8. A MOS technology power device comprising:
a semiconductor material layer of a first conductivity type;
a first insulating material layer above the semiconductor material layer;
a conductive material layer above the first insulating material layer;
a plurality of elementary functional units, each elementary functional unit including:
an elongated body region of a second conductivity type formed in the semiconductor material layer and having a length;
a first elongated window in the first insulating material layer and the conductive material layer above the elongated body region, having a length along the length of the elongated body region and having a plurality of elongated edges in the first insulating material layer and the conductive material layer;
a source region of the first conductivity type disposed in the elongated body region along the length of elongated body region;
a second insulating material layer disposed above the conductive material layer and at each elongated edge of the first elongated window, having a second elongated window disposed therein along the length of the elongated body region;
a metal layer disposed above the second insulating material layer, contacting a body portion of the elongated body region wherein no dopant of the first conductivity type is provided and the source region through the second elongated window along the length of the elongated body region; and
wherein the elongated body region includes a first longitudinal half-stripe and a second longitudinal half-stripe, each longitudinal half-stripe having a length along the length of the elongated body region and merged together along a longitudinal edge of the first longitudinal half-stripe and the second longitudinal half-stripe, wherein the first longitudinal half-stripe includes the source region which is an elongated source region having a length extending along the length of the first longitudinal half-stripe for substantially the entire length of the first longitudinal half-stripe and a substantially constant width, the first longitudinal half-stripe extending along the elongated body region for substantially the entire length of the elongated body region and the second longitudinal half-stripe extending along the elongated body region for substantially the entire length of the elongated body region and having no dopants of the first conductivity type.

9. The MOS technology power device according to any one of claims 1, 3, 4 or 8, wherein the first insulating material layer is an oxide layer, the conductive material layer is a polysilicon layer, and the second insulating material layer is a passivation layer.

10. The MOS technology power device according to claim 9, wherein the polysilicon layer is doped with a dopant so as to have a low resistivity.

11. The MOS technology power device according to claim 9, further comprising a silicide layer interposed between the polysilicon layer and the passivation layer.

12. The MOS technology power device according to claim 11, wherein the silicide layer is a cobalt silicide layer.

13. The MOS technology power device according to any one of claims 1, 4, 6 or 8, wherein the semiconductor material layer is superimposed over a semiconductor material substrate.

14. The MOS technology power device according to claim 13, wherein the semiconductor material layer is lightly doped, and the semiconductor material substrate is heavily doped.

15. The MOS technology power device according to claim 14, wherein the semiconductor material substrate is of the first conductivity type.

16. The MOS technology power device according to claim 14, wherein the semiconductor material substrate is of the second conductivity type.

17. The MOS technology power device according to any one of claims 1, 4, 6 or 8, wherein the first conductivity type is N-type, and the second conductivity type is P-type.

18. The MOS technology power device according to any one of claims 1, 4, 6 or 8 wherein the first conductivity type is P-type, and the second conductivity type is N-type.

19. A MOS-gated apparatus, comprising:
a semiconductor material of a first conductivity type;
a plurality of elongated body regions of a second conductivity type formed in a surface of the semiconductor material, each elongated body region having body portions wherein no dopants of the first conductivity exist and having a length;
a source region of the first conductivity type formed in a surface of each elongated body region along the length of each elongated body region;
a first insulating material layer disposed above the surface of the semiconductor material;
a conductive layer disposed above the first insulating material layer;
a plurality of first elongated windows in the first insulating material layer and the conductive material layer having a plurality of elongated edges in the first insulating material layer and the conductive material layer, each first elongated window having a length along the length of a respective elongated body region and exposing a respective source region and the respective elongated body region;
a second insulating material layer disposed above the conductive material layer and at each elongated edge of the first elongated window, having a plurality of second elongated windows disposed therein, each second elongated window having a length along the length of a respective elongated body region;
a metal layer disposed above the second insulating material layer and contacting each body portion and each source region along the length of each elongated body region through the plurality of second elongated windows;
wherein each source region includes a plurality of source portions disposed along the length of the respective elongated body region which are intercalated with the body portions of the respective elongated body region; and
wherein each elongated body region includes a central heavily doped elongated deep body portion having elongated edges substantially aligned with the elongated edges of the first elongated window and lateral lightly doped elongated regions disposed at lateral edges of the elongated body region and underneath the conductive material layer, the lateral lightly doped elongated regions forming a channel region of the MOS-gated apparatus.

20. A MOS-gated apparatus, comprising:

a semiconductor material of a first conductivity type;

a plurality of elongated body regions of a second conductivity type formed in a surface of the semiconductor material, each elongated body region having body portions wherein no dopants of the first conductivity exist and having a length;

a source region of the first conductivity type formed in a surface of each elongated body region along the length of each elongated body region;

a first insulating material layer disposed above the surface of the semiconductor material;

a conductive layer disposed above the first insulating material layer;

a plurality of first elongated windows in the first insulating material layer and the conductive material layer having a plurality of elongated edges in the first insulating material layer and the conductive material layer, each first elongated window having a length along the length of a respective elongated body region and exposing a respective source region and the respective elongated body region;

a second insulating material layer disposed above the conductive material layer and at each elongated edge of the first elongated window, having a plurality of second elongated windows disposed therein, each second elongated window having a length along the length of a respective elongated body region;

a metal layer disposed above the second insulating material layer and contacting each body portion and each source region along the length of each elongated body region through the plurality of second elongated windows;

wherein each source region includes a plurality of source portions having a first length disposed along the length of the respective elongated body region which are intercalated along the length of the respective elongated body region with the body portions of the respective elongated body region having a second length along the length of the respective elongated body region; and wherein the first length of each source portion is greater than the second length of each body portion.

21. The MOS-gated apparatus as claimed in claim 20, wherein each source portion in one body region is substantially aligned in a direction transverse to the length of the body region with a respective source portion in each adjacent body region, and wherein each body portion within the body region is substantially aligned in the transverse direction with a respective body portion in each adjacent body region.

22. The MOS-gated apparatus as claimed in claim 20, wherein each source portion in one body region is shifted in a longitudinal direction of the body region with respect to a respective source region within each adjacent body region, and wherein each body portion within the body region is shifted in the longitudinal direction with respect to a respective body portion in each adjacent body region.

23. A MOS-gated apparatus, comprising:

a semiconductor material of a first conductivity type;

a plurality of elongated body regions of a second conductivity type formed in a surface of the semiconductor material, each elongated body region having body portions wherein no dopants of the first conductivity exist and having a length and a width;

a source region of the first conductivity type formed in a surface of each elongated body region along the length of each elongated body region;

a first insulating material layer disposed above the surface of the semiconductor material;

a conductive layer disposed above the first insulating material layer;

a plurality of first elongated windows in the first insulating material layer and the conductive material layer having a plurality of elongated edges in the first insulating material layer and the conductive material layer, each elongated window having a length along the length of a respective elongated body region and exposing a respective source region and the respective elongated body region;

a second insulating material layer disposed above the conductive material layer and at each elongated edge of the first elongated window, having a plurality of second elongated windows disposed therein, each second elongated window having a length along the length of a respective elongated body region and having a width;

a metal layer disposed above the second insulating material layer and contacting each body portion and each source region along the length of each elongated body region through the plurality of second elongated windows;

wherein each source region includes a plurality of source portions having a first length disposed along the length of the respective elongated body region which are intercalated along the length of the respective elongated body region with the body portions of the respective elongated body region having a second length along the length of the respective elongated body region; and wherein the first length is substantially equal to the second length and a width of the source portions is greater than the width of the second elongated window in the second insulating material layer so that each source portion contacts the metal layer through substantially the entire width of the second elongated window in the second insulating material layer.

24. The MOS-gated apparatus as claimed in claim 23, wherein each source portion in one body region is substantially aligned in a transverse direction to the length of the body region with a respective body portion in each adjacent body region.

25. A MOS-gated apparatus, comprising:

a semiconductor material of a first conductivity type;

a plurality of elongated body regions of a second conductivity type formed in a surface of the semiconductor material, each elongated body region having body portions wherein no dopants of the first conductivity exist and having a length;

a source region of the first conductivity type formed in a surface of each elongated body region along the length of each elongated body region;

a first insulating material layer disposed above the surface of the semiconductor material;

a conductive layer disposed above the first insulating material layer;

a plurality of first elongated windows in the first insulating material layer and the conductive material layer having a plurality of elongated edges in the first insulating material layer and the conductive material layer, each first elongated window having a length along the length of a respective elongated body region and exposing a respective source region and the respective elongated body region;

a second insulating material layer disposed above the conductive material layer and at each elongated edge of the first elongated window, having a plurality of second elongated windows disposed therein, each second elongated widow having a length along the length of a respective elongated body region;

a metal layer disposed above the second insulating material layer and contacting each body portion and each source region along the length of each elongated body region through the plurality of second elongated windows; and wherein the elongated body region includes a first elongated stripe and a second elongated stripe each having a length along the length of the elongated body region and merged together along an elongated edge of each of the first elongated stripe and the second elongated stripe, each of the first elongated stripe and the second elongated stripe including a plurality of source portions and the body portions extending along the length of the first elongated stripe and the second elongated stripe, each source portion of the first elongated stripe being substantially aligned in a direction transverse to the length of the first elongated stripe with each body portion of the second elongated stripe, and each body portion of the first elongated stripe being substantially aligned in the transverse direction with each source portion of the second elongated stripe so that at least one corner of the source portions along the elongated edge of the first elongated stripe touches a corner of a source portion of the second elongated stripe.

26. A MOS-gated apparatus, comprising:

a semiconductor material of a first conductivity type;

a plurality of elongated body regions of a second conductivity type formed in a surface of the semiconductor material, each elongated body region having a length;

a source region of the first conductivity type formed in a surface of each elongated body region along the length of each elongated body region;

a first insulating material layer disposed above the surface of the semiconductor material;

a conductive layer disposed above the first insulating material layer;

a plurality of first elongated windows in the first insulating material layer and the conductive material layer having a plurality of elongated edges in the first insulating material layer and the conductive material layer, each first elongated window having a length along the length of a respective elongated body region and exposing a respective source region and the respective elongated body region;

a second insulating material layer disposed above the conductive material layer and at each elongated edge of the first elongated window, having a plurality of second elongated windows disposed therein, each second elongated window having a length along the length of a respective elongated body region;

a metal layer disposed above the second insulating material layer and contacting each body portion and each source region along the length of each elongated body region through the plurality of second elongated windows; and wherein each elongated body region includes a first longitudinal half-stripe and a second longitudinal half-strip, each half-stripe having a length along the length of the elongated body region and merged together along a longitudinal edge of the first longitudinal half-stripe and the second longitudinal half-stripe, and wherein the first longitudinal half-stripe includes the source region which is an elongated source region having a length along substantially the entire length of the first longitudinal half-stripe and a substantially constant width, the first longitudinal half-stripe extending along the elongated body region for substantially the entire length of the elongated body region and the second longitudinal half-stripe extending along the elongated body region for substantially the entire length of the elongated body region.

27. The MOS-gated apparatus as claimed in any one of claims 19, 20, 23, 25 or 26, further comprising a silicide layer disposed above the conductive material layer and beneath the second insulating material layer.

* * * * *

UNITED STATES PATENT AND TRADEMARK OFFICE
CERTIFICATE OF CORRECTION

PATENT NO. : 6,054,737
APPLICATION NO. : 08/738584
DATED : April 25, 2000
INVENTOR(S) : Angelo Magri'

It is certified that error appears in the above-identified patent and that said Letters Patent is hereby corrected as shown below:

At column 28, claim 26, line 28, please change "strip" to "stripe".

Signed and Sealed this
Twenty-sixth Day of February, 2013

Teresa Stanek Rea
*Acting Director of the United States Patent and Trademark Office*